United States Patent
Baumbach

(10) Patent No.: US 8,878,811 B1
(45) Date of Patent: Nov. 4, 2014

(54) INTEGRATED NORMAL SENSING AND PROXIMITY SENSING ON A MULTI-DIMENSIONAL SENSOR ARRAY

(75) Inventor: Jason G. Baumbach, Campbell, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 162 days.

(21) Appl. No.: 12/483,181

(22) Filed: Jun. 11, 2009

Related U.S. Application Data

(63) Continuation of application No. 11/823,361, filed on Jun. 26, 2007.

(60) Provisional application No. 60/910,405, filed on Apr. 5, 2007.

(51) Int. Cl.
*G06F 3/045* (2006.01)
*G06F 3/044* (2006.01)
*H03K 17/955* (2006.01)

(52) U.S. Cl.
CPC ...... *G06F 3/044* (2013.01); *H03K 2217/94026* (2013.01); *H03K 17/955* (2013.01)
USPC .................................................. 345/174

(58) Field of Classification Search
None
See application file for complete search history.

(56) References Cited

U.S. PATENT DOCUMENTS

| | | |
|---|---|---|
| 4,103,252 A | 7/1978 | Bobick |
| 4,293,734 A | 10/1981 | Pepper, Jr. |
| 4,550,221 A | 10/1985 | Mabusth |
| 4,736,191 A | 4/1988 | Matzke et al. |
| 5,274,371 A | 12/1993 | Yang et al. |
| 5,305,017 A | 4/1994 | Gerpheide |
| 5,543,590 A | 8/1996 | Gillespie et al. |
| 5,543,591 A | 8/1996 | Gillespie et al. |
| 5,730,602 A | 3/1998 | Gierhart et al. |
| 5,748,185 A | 5/1998 | Stephan et al. |
| 5,872,561 A | 2/1999 | Figie et al. |
| 5,943,052 A | 8/1999 | Allen et al. |
| 6,028,271 A | 2/2000 | Gillespie et al. |
| 6,037,929 A | 3/2000 | Ogura et al. |
| 6,188,391 B1 | 2/2001 | Seely et al. |
| 6,262,717 B1 | 7/2001 | Donohue et al. |
| 6,380,931 B1 | 4/2002 | Gillespie et al. |

(Continued)

FOREIGN PATENT DOCUMENTS

| | | |
|---|---|---|
| EP | 0574213 A1 | 12/1993 |
| FR | 2662528 A | 11/1991 |
| WO | 0002188 A | 1/2000 |
| WO | WO 00/02188 A1 | 1/2000 |

OTHER PUBLICATIONS

U.S. Appl. No. 11/823,361: "Integrated button Activation Sensing and Proximity Sensing," Jason Baumbach, filed Jun. 26, 2007; 100 pages.

(Continued)

*Primary Examiner* — Jason Olson

(57) ABSTRACT

Apparatuses and methods for coupling a group of sensor elements together in one mode to collectively measure a capacitance on the group of sensor elements, in addition to individually measuring a capacitance on each of the sensor elements in another mode. The apparatus may include a processing device, and a plurality of sensor elements that are individually coupled in a first mode for normal sensing and collectively coupled in a second mode for proximity sensing.

20 Claims, 16 Drawing Sheets

(56) References Cited

U.S. PATENT DOCUMENTS

| | | | |
|---|---|---|---|
| 6,414,671 | B1 | 7/2002 | Gillespie et al. |
| 6,498,720 | B2 | 12/2002 | Glad |
| 6,574,095 | B2 | 6/2003 | Suzuki |
| 6,704,005 | B2 | 3/2004 | Kato et al. |
| 6,825,890 | B2 | 11/2004 | Matsufusa |
| 7,030,860 | B1 | 4/2006 | Hsu et al. |
| 7,158,056 | B2 | 1/2007 | Wright et al. |
| 8,144,126 | B2 * | 3/2012 | Wright ............................ 345/173 |
| 2006/0066582 | A1 | 3/2006 | Lyon et al. |
| 2007/0074913 | A1 * | 4/2007 | Geaghan et al. ............ 178/18.06 |

OTHER PUBLICATIONS

Adam Chapweske, "The PS/2 Mouse Interface," Copyright 2001; 10 pages.
Mark Lee, "CapSense Best Practices," Cypress Application Note AN2394; Oct. 19, 2006; 10 pages.
R. Seguine et al., "Layout Guidelines for PSoC CapSense," Cypress Application Note AN2292, Revision B; Oct. 30, 2005; 15 pages.
Dennis Seguine, "Capacitive Switch San," Cypress Application Note AN2233a, Revision B; Apr. 14, 2005; 6 pages.
Dave Van Ess, "Understanding Switched Capacitor Analog Blocks," Cypress Application Note AN2041, Revision B; Mar. 30, 2004; 16 pages.
CSR User Module Data Sheet, Cypress Semiconductor Corporation CSR v1.0 "CY8C21x34 Data Sheet," Oct. 6, 2006; 36 pages.
CSD User Module Data Sheet, Cypress Semiconductor Corporation CSD v1.0, Oct. 23, 2006; 58 pages.
International Search Report from the International Searching Authority for International Application No. PCT/US99/15161 dated Sep. 2, 1999; 1 page.
European Search Report from the European Patent Office for European Application No. 93304403.4 dated Sep. 6, 1993; 1 page.
Chun et al., "A High-Performance Silicon Tactile Imager Based on a Capacitor Cell," IEEE Transactions on Electron Devices, vol. Ed.-32, No. 7, Jul. 1985; pp. 1196-2001; 6 pages.
U.S. Appl. No. 10/888,666: "Method and Apparatus or Scanning a Key or Button Matrix," Wright et al., filed Jul. 8, 2004; 27 pages.
USPTO Notice of Allowance for U.S. Appl. No. 10/888,666 dated Aug. 2, 2006; 11 pages.
USPTO Miscellaneous Action for U.S. Appl. No. 10/888,666 dated Jul. 11, 2005; 1 page.
U.S. Appl. No. 11/613,946: "Method and Apparatus for Scanning a Key or Button Matrix," Wright et al., filed Dec. 20, 2006; 22 pages.
USPTO Notice of Allowance for U.S. Appl. No. 11/613,946 dated Jun. 22, 2009; 5 pages.
USPTO Non-Final Rejection for U.S. Appl. No. 11/613,946 dated Feb. 10, 2009; 5 pages.
International Search Report of the international Searching Authority for International Application No. PCT/US05/23468 dated Aug. 25, 2006; 2 pages.
Written Opinion of the International Searching Authority or International Application No. PCT/US05/23168 dated Aug. 25, 2006; 7 pages.
USPTO Advisory Action for U.S. Appl. No. 11/823,361 dated May 2, 2012; 2 pages.
USPTO Advisory Action for U.S. Appl. No. 11/823,361 dated Jul. 27, 2011; 2 pages.
USPTO Final Rejection for U.S. Appl. No. 11/823,361 dated Apr. 3, 2012; 9 pages.
USPTO Final Rejection for U.S. Appl. No. 11/823,361 dated May 24, 2011; 9 pages.
USPTO Non-Final Rejection for U.S. Appl. No. 11/823,361 dated Dec. 8, 2010; 8 pages.
USPTO Non-Final Rejection for U.S. Appl. No. 11/823,361 dated Dec. 21, 2011; 8 pages.
USPTO Final Rejection for U.S. Appl. No. 11/823,361 dated Mar. 10, 2014; 10 pages.
USPTO Non Final Rejection for U.S. Appl. No. 11/823,361 dated Oct. 3, 2013; 8 pages.
USPTO Notice of Allowance for U.S. Appl. No. 11/823,361 dated Aug. 15, 2014; 8 pages.

* cited by examiner

INTEGRATED NORMAL SENSING AND PROXIMITY SENSING ON A MULTI-DIMENSIONAL SENSOR ARRAY

RELATED APPLICATIONS

This application is a continuation of application Ser. No. 11/823,361, filed Jun. 26, 2007, which claims the benefit of U.S. Provisional Application No. 60/910,405, filed Apr. 5, 2007, each of which is incorporated by reference herein in its entirety.

TECHNICAL FIELD

This invention relates to the field of user interface devices and, in particular, to touch-sensor devices.

BACKGROUND

Computing devices, such as notebook computers, personal data assistants (PDAs), kiosks, and mobile handsets, have user interface devices, which are also known as human interface devices (HID). One such user interface device is a touch panel having multiple buttons for controlling a device, such as a touch panel of a television (TV), a video cassette recorder (VCR), a digital video recorder (DVR), a digital video disc (DVD) player, a receiver, a computer, a radio, lights, fans, industrial equipment, or the like. For example, considering a standard consumer electronics device like a DVD player, the DVD player front panel has buttons that form a user interface (UI). In general terms, a UI receives input from the user and allows the user to interact with an electronic device. Some UIs use traditional mechanical buttons and some newer UIs use touch-sensor buttons (e.g., capacitance sensing buttons).

Capacitance sensing is used in wide variety of user interface applications. Examples include touchpads on notebook computers, touchscreens, slider controls used for menu navigation in cellular phones, personal music players, and other hand held electronic devices. One type of capacitance touch-sensor device operates by way of capacitance sensing utilizing capacitive sensors. One way in which the capacitance detected by a capacitive sensor changes is as a function of the proximity of a conductive object to the sensor. The conductive object can be, for example, a stylus or a user's finger. The touch-sensor devices may include single sensor elements or elements arranged in multiple dimensions for detecting a presence of the conductive object on the touch-sensor device. Regardless of the method, usually an electrical signal representative of the capacitance detected by each capacitive sensor is processed by a processing device, which in turn produces electrical or optical signals representative of activation, position, or the like of the conductive object in relation to the touch-sensor device, such as a touch panel. A touch-sensor strip, slider, or touchpad operates on the same capacitance-sensing principle.

Capacitance sensing has been implemented in a wide variety of electronic devices to replace mechanical buttons in the electronic devices. Capacitance sensing has many advantages over conventional cursor control devices, mechanical switches, and rotary encoders. A principal such advantage is the lack of moving parts, which allows capacitance sensing to provide great improvements in reliability since there are no moving parts to wear out.

Typically, a capacitance sensing system detects changes in capacitance between a sensing element and electrical ground. For example, in a capacitance sensing button, when the users' finger is in close proximity to the sensor element, a capacitance is formed between the sensor element and the finger, and as the finger is effectively at a ground potential, a detectable capacitance to ground is present when the user's finger is close to the sensor element. In a touchpad or slider, the position of the user's finger is detected by measuring the difference in capacitance to ground between a number of sensing elements arranged as an array. The capacitance sensing system detects the presence of the user's finger over a button area and registers a button press as a result.

One type of conventional capacitance sensing touch panel 100, as illustrated in FIG. 1, includes eight touch-sensor buttons 101, which each include a sensor element 102. Surrounding each sensor element 102 is a dielectric 103 (e.g., dielectric material or air) that separates the touch-sensor buttons 101 from a ground conductor 104 that is disposed to surround the sensor elements 102. The change in capacitance on the sensor element 102 resulting from the introduction of either a conductive object into close proximity to the sensor element 102 is sensed. Electric field lines which run between conductive elements, namely the ground conductor 104 and the sensor element 102, through the dielectric 103 and the dielectric above and below the touch panel 100. When nothing changes (e.g., the configuration is static), a given sensor element 102 has a fixed capacitance determined by the properties of the conductor, the dielectric, geometry of the assembly, environmental conditions, as well as other factors. Introduction of a conductive object into close proximity to the sensor element 102 changes the environment, which consequently changes the capacitance of the sensor element 102. For example, placing a finger in proximity to the sensor element 102 raises the capacitance on sensor element 102. The increase in capacitance is registered by the capacitance sensing device as a "button press."

In almost all button-press applications of capacitance sensing, the conductive elements (e.g., sensor elements 102 and ground conductor 104) are isolated from the user by a dielectric material as an overlay. Since the electric field penetrates the overlay, when the user's finger (or other conductive object) is in proximity to the sensor element 102, the capacitance sensing device can detect a change in the capacitance. It should be noted that since the conductive elements are isolated by an overlay, the sensor elements 102 are not actually touched by the conductive object. As such, sensor elements, such as sensor elements 102, are considered to be proximity sense technology. However, in the proximity sense technology, the sensor element 102 may be a "capacitive proximity sensor" or a "capacitive button sensor" (e.g., touch-sensor button). Whether a sensor element 102 is considered to be a capacitive proximity sensor or a touch-sensor button is based on the sensitivity of the processing device, which processes the data from sensor element 102. The difference between a capacitive proximity sensor and a capacitive button sensor is that the proximity sensor is tuned to respond before the user touches the dielectric overlay and the button sensor is tuned to respond when the user actually touches the surface of the dielectric overlay. As a result, a proximity sensor is usually tuned to be much more sensitive to a change in capacitance than capacitive button sensors. For technical reasons, standard engineering practice for capacitive button sensors is to use a "ground" conductor 104 that surrounds the capacitive button 101.

Conventional UIs that implement both proximity sensing and button-activation sensing use a dedicated, discrete proximity sensor. The proximity sensor element is physically separate from the sensor elements required for capacitive button sensing. For example, the touch panel 100, which includes both proximity sensing and button-activation sensing, requires an additional sensor element 106 to perform proximity sensing, as illustrated in FIG. 1B. The additional proximity sensor element 106 is disposed around the perimeter of the touch panel 100, and is separated from the ground conductor 104 by a dielectric 105. The capacitive proximity sensor 106 is usually large due to the use model, since the desired use model for a proximity sensor is to detect when the user's hand is in proximity to the area of the user interface (e.g., touch panel 100), as opposed to touching the overlay of one of the touch sensor buttons. The capacitive proximity sensor 106 usually surrounds the user interface.

BRIEF DESCRIPTION OF THE DRAWINGS

The present invention is illustrated by way of example, and not by way of limitation, in the figures of the accompanying drawings.

DETAILED DESCRIPTION

Figure 1A:
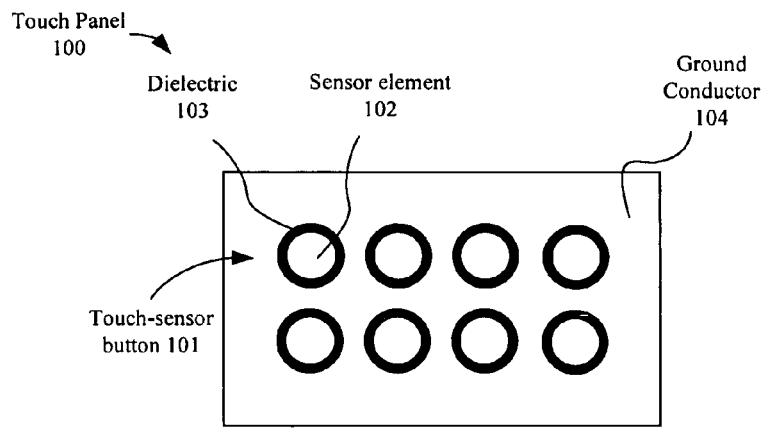
FIG. 1A illustrates a conventional touch panel having eight touch-sensor buttons surrounded by a ground conductor.
Figure 1B:
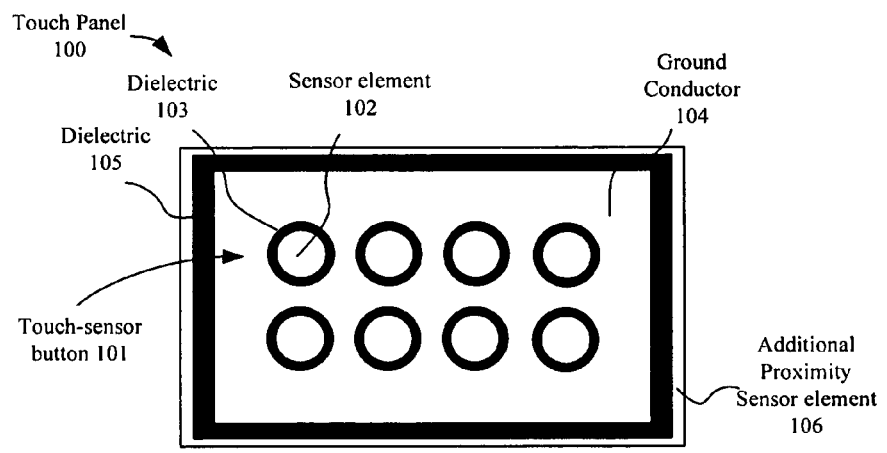
FIG. 1B illustrates the conventional touch panel of FIG. 1 including an additional proximity sensor element for proximity sensing.

Described herein are apparatuses and methods for integrated proximity and button-activation sensing using already existing hardware of the capacitance sensing device. The following description sets forth numerous specific details such as examples of specific systems, components, methods, and so forth, in order to provide a good understanding of several embodiments of the present invention. It will be apparent to one skilled in the art, however, that at least some embodiments of the present invention may be practiced without these specific details. In other instances, well-known components or methods are not described in detail or are presented in simple block diagram format in order to avoid unnecessarily obscuring the present invention. Thus, the specific details set forth are merely exemplary. Particular implementations may vary from these exemplary details and still be contemplated to be within the spirit and scope of the present invention.

Embodiments of a method and apparatus are described to couple a group of sensor elements together in one mode to collectively measure a capacitance on the group of sensor elements, in addition to individually measuring a capacitance on each of the sensor elements in another mode. The embodiments described herein use the sensor elements of the touch-sensor buttons to perform both proximity sensing and button-activation sensing. In one embodiment, the touch-sensor buttons are used individually for button-activation sensing, and the touch-sensor buttons are used collectively for proximity detection. In another embodiment, the touch-sensor buttons are used individually for button-activation sensing, and the touch-sensor buttons and a ground conductor that surrounds the touch-sensor buttons are collectively used for proximity detection. In another embodiment, any conductive material (e.g., metal) of a housing of an electronic device is used for proximity detection. As such, the embodiments described herein do not use an additional proximity sensor (e.g., dedicated, discrete proximity sensor) to detect a presence of a conductive object in proximity to a device, but use the already existing conductive elements (e.g., sensor elements, ground conductors, or other conductive material present in the electronic device) to detect both button-activations as well as proximity activations (e.g., proximity events, such as activating a display).

In one embodiment of the method, a presence of a conductive object on a device (e.g., button-activation sensing) is detected by individually measuring a capacitance on each sensor element of the device, and a presence of the conductive object in proximity to the device (e.g., proximity event) is detected by collectively measuring a capacitance on a group of couple sensor elements. In one embodiment, the sensitivity of the touch-sensor button can be configured so that the touch-sensor button is activated when the conductive object is on the touch-sensor button, such as touching an area of the overlay that corresponds to the touch-sensor device. As described above, sensitivity of the sensor element can be tuned to responds when the user actually touches (e.g., with the conductive object) the surface of the overlay. The sensor elements as described herein are individually configured to be tuned to respond when the user actually touches the overlay to register a button-activation (e.g., capacitive button sensor). The sensor elements are also configured to be tuned to response before the user touches the overlay to register a proximity event when coupled together (e.g., proximity sensor).

In one embodiment, the apparatus includes a processing device, and multiple sensor elements coupled to the processing device. The processing device may be individually coupled to the processing device in a first mode to detect a presence of a conductive object on the device, and a group of sensor elements are collectively coupled to the processing device in a second mode to detect a presence of a conductive object in proximity to the device.

Touch-sensitive devices operate on a scanning basis. Each sensor element is connected to the capacitance sensing circuit in turn through an electronic switch, and its capacitance is measured in a first mode. In a second mode, rather than measuring the capacitance of each of the sensor elements in turn, a group of the sensor elements are connected together, and a single "coarse" measurement of the total aggregate capacitance on the group of sensor elements is made. If the total aggregate capacitance is greater than a pre-determined minimum value (e.g., a low-pass filtered version of recent capacitance measurements), then a proximity event has been determined, and a corresponding proximity operation may be performed, such as lighting a backlight on a display, as well as other user input functions.

In one embodiment, the group of sensor elements can be all of the sensor elements in the touch-sensitive device. Alternatively, less than all of the sensor elements, for example, ½, ⅓, ¼, or other fractions of the sensor elements can be coupled together in alternating or non-alternating patterns. In one exemplary embodiment, when implementing a slider, which includes a number of closely-located sensor elements, half of the sensor elements may be coupled together for collectively measuring the capacitance on the slider (e.g., "coarse" measurement) in the second mode, while all of the sensor elements are individually measured in the first mode. This may have the advantage of reducing the background "parasitic" capacitance to ground, and thus, reducing the time taken to make the "coarse" measurement in the second mode since less than all of the sensor elements are coupled together in the second mode. Similarly, in one embodiment of a touchpad implementation, only the rows or columns, but not both may be connected together when taking the "coarse" measurement on the coupled sensor elements during the second mode. In another embodiment, only half of the rows or columns (e.g., alternating rows or columns) are coupled together to make the "coarse" measurement during the second mode. In another embodiment, a first group of sensor elements are coupled together in a first zone, and a second group of sensor elements are coupled together in a second zone. A first capacitance measurement is made on the sensor elements of the first zone, and second capacitance measurement is made on the sensor elements of the second zone. A first proximity event is determined if the conductive object is detected in proximity to the first zone using the first capacitance measurement, and a second proximity event is determined if the conductive object is detected in proximity to the second zone using the second capacitance measurement. A button activation is determined when the conductive object is detected on (e.g., touching the area of the overlay that corresponds to) one of the sensor elements. Determination of the first and second proximity events may trigger separate operations, such as activating respective portions of a display, or the like. Determination of the button activation may trigger a button operation, such as input entry, or the like. Alternatively, other configurations are possible.

By making only a single capacitance measurement during each sensing interval when detecting the presence of the conductive object in proximity to the device, the time taken to determine whether a conductive object has recently become present is greatly reduced. Thus, the power consumption in the proximity sensing mode is similarly reduced, such as by reducing the amount of current consumed to determine if a conductive object is in proximity to the device. The proximity sensing may be used in a "sleep" mode that is a reduced power mode, as compared to the active or normal mode. The parasitic capacitance of the sensor elements to ground may be greater when all of the sensor elements are connected together than for an individual sensor element, and the time taken to measure the capacitance may be proportional to the capacitance to ground. For example, in a 40-button remote control example, the time taken to measure the capacitance of all 40 buttons connected together may be 500 µs, as opposed to the 250 µs for an individual button. As such, when detecting the presence of the conductive object in proximity to the device (e.g., in the sleep mode), the "sleep" current may be reduced from 250 µA to 12.5 µA. Upon determining that the conductive object is in proximity to the device, the device may transition to an active or normal state, in which the device is configured to individually measure the capacitance on each of the sensor elements to detect the presence of the conductive object on (e.g., touching a surface of the overlay correspond to) one of the sensor elements of the device. The embodiments described herein may provide an advantage of using capacitance sensing in remote control and other battery-operated devices because the power consumption in the reduced power mode is reduced.

As the combined area of all or a fraction of the sensor elements is much greater than that of a single sensor element, the capacitance between the combined area and a finger that is close, but not touching the sensor elements is much greater than between the finger and a single sensor element. This characteristic may be used to provide additional features, such as, for example, a remote control could potentially detect a hand moved over it at several inches distance. This could be used to turn on a backlight, enabling a user to locate the remote control in a dark room simply by waving a hand over the approximate location of the remote control, for example, on a side table. Similarly, the embodiments described herein may be used to detect and interpret gestures made in the air over the touch-sensitive device (e.g., touchpad); such gestures could be separate from and independent of the usual gestures typically recognized by the touch-sensitive device. For example, in one embodiment, the page-up and page-down gestures are activated by waving a finger or hand over the top of the touch-sensitive device (e.g., touchpad) without touching the surface. Alternatively, other types of gestures may be implemented.

It should be noted that in other embodiments, the capacitance sensing applications may use a pair of capacitance sensing circuits, allowing two buttons (or sensor elements of a touchpad or a slider) to be sensed simultaneously. In one embodiment, half of the sensor elements active in one mode may be connected to each of the sensing circuits, and two "coarse" capacitance measurements are made simultaneously. This may have the advantage of reducing the time taken to make the capacitance measurement, as the parasitic capacitance of each group is less than the parasitic capacitance when both groups are combined.

The embodiments described herein may provide an advantage over conventional capacitance sensing systems by allowing both button-activation sensing and proximity sensing without using an additional proximity sensor. The embodiments described herein may also provide an advantage over conventional capacitance sensing systems by reducing sleep current to a level where capacitance sensing becomes a viable option in applications where the current consumption of conventional capacitance sensing systems is unacceptably high. The embodiments described herein may also provide the benefit of increasing battery life of the device. The embodiments described herein may also enable detection of conductive objects (e.g., fingers or hands) at greater distances than conventional systems.

It should be noted that the embodiments described herein are different than sensing devices that use a 2-stage sensing process. In the 2-stage sensing process, the sensor elements are divided into multiple groups, and each group of sensor elements is connected together and the aggregate capacitance of each group is measured to determine in which group the finger is detected. Then when it has been determined in which group the finger is located, each of the sensor elements of that group is sensed individually. In the embodiments described herein, only a single group of sensor elements (e.g., a fraction or all of the sensor elements) is measured, rather than multiple groups of sensor elements that are measured each in turn. The embodiments described herein also only measure a group of coupled sensor elements when detecting a presence of a conductive object in proximity to the device.

Figure 2:
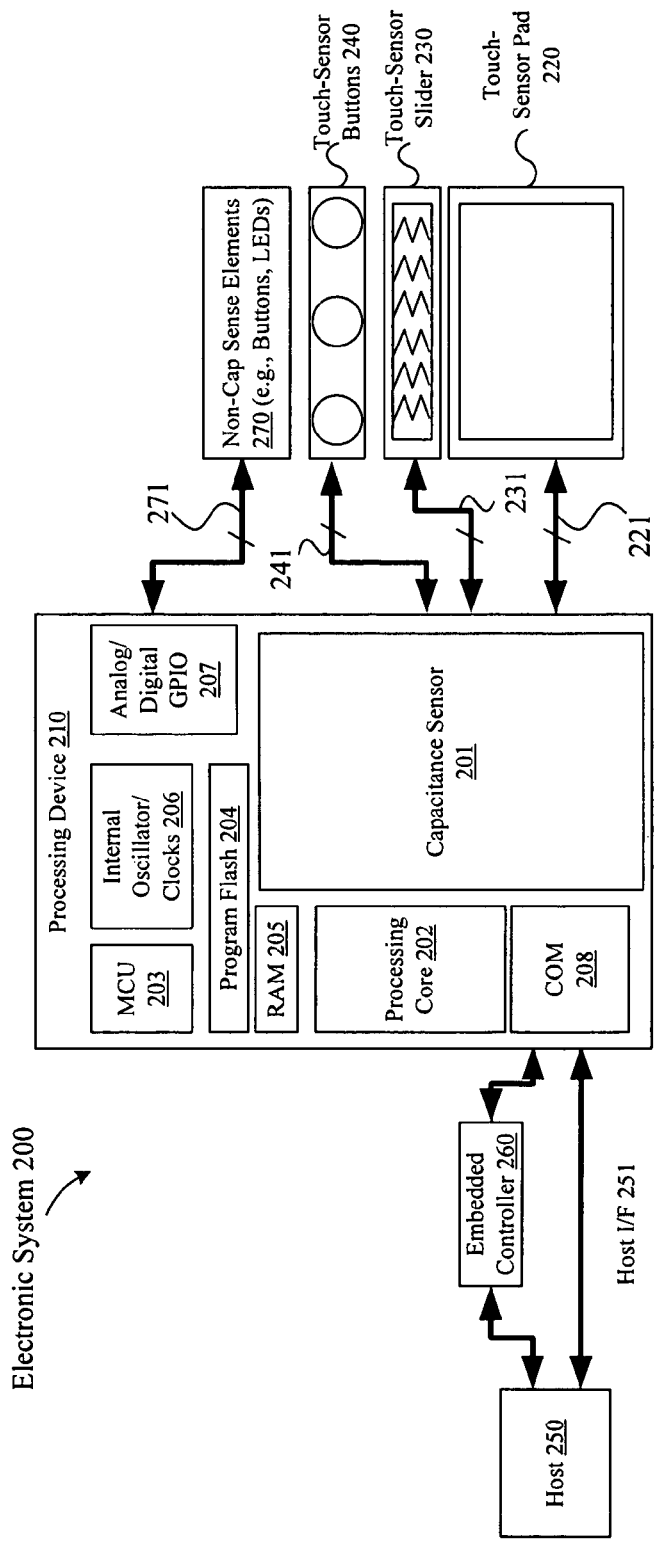
FIG. 2 illustrates a block diagram of one embodiment of an electronic system having a processing device for detecting a presence of a conductive object.

FIG. 2 illustrates a block diagram of one embodiment of an electronic system having a processing device for detecting a presence of a conductive object. Electronic system 200 includes processing device 210, touch-sensor pad 220, touch-sensor slider 230, touch-sensor buttons 240, host processor 250, embedded controller 260, and non-capacitance sensor elements 270. The processing device 210 may include analog and/or digital general purpose input/output ("GPIO") ports 207. GPIO ports 207 may be programmable. GPIO ports 207 may be coupled to a Programmable Interconnect and Logic ("PIL"), which acts as an interconnect between GPIO ports 207 and a digital block array of the processing device 210 (not illustrated). The digital block array may be configured to implement a variety of digital logic circuits (e.g., DAC, digital filters, digital control systems) using, in one embodiment, configurable user modules ("UMs"). The digital block array may be coupled to a system bus (not illustrated). Processing device 210 may also include memory, such as random access memory (RAM) 205 and program flash 204. RAM 205 may be static RAM (SRAM) or the like, and program flash 204 may be a non-volatile storage, or the like, which may be used to store firmware (e.g., control algorithms executable by processing core 202 to implement operations described herein). Processing device 210 may also include a memory controller unit (MCU) 203 coupled to memory and the processing core 202.

The processing device 210 may also include an analog block array (not illustrated). The analog block array is also coupled to the system bus. Analog block array also may be configured to implement a variety of analog circuits (e.g., ADC, analog filters) using, in one embodiment, configurable UMs. The analog block array may also be coupled to the GPIO 207.

As illustrated, capacitance sensor 201 may be integrated into processing device 210. Capacitance sensor 201 may include analog I/O for coupling to an external component, such as touch-sensor pad 220, touch-sensor slider 230, touch-sensor buttons 240, and/or other devices. Capacitance sensor 201 and processing device 210 are described in more detail below.

It should be noted that the embodiments described herein are not limited to touch-sensor pads for notebook implementations, but can be used in other capacitive sensing implementations, for example, the sensing device may be a touch screen, a touch-sensor slider 230, or a touch-sensor button 240 (e.g., capacitance sensing button). It should also be noted that the embodiments described herein may be implemented in other sensing technologies than capacitive sensing, such as resistive, optical imaging, surface acoustical wave (SAW), infrared, dispersive signal, and strain gauge technologies. Similarly, the operations described herein are not limited to notebook pointer operations, but can include other operations, such as lighting control (dimmer), temperature or environmental control, volume control, graphic equalizer control, speed control, or other control operations requiring gradual or discrete adjustments. It should also be noted that these embodiments of capacitive sensing implementations may be used in conjunction with non-capacitive sensing elements, including but not limited to pick buttons, sliders (ex. display brightness and contrast), scroll-wheels, multi-media control (ex. volume, track advance, etc.) handwriting recognition and numeric keypad operation.

In one embodiment, the electronic system 200 includes a touch-sensor pad 220 coupled to the processing device 210 via bus 221. Touch-sensor pad 220 may include a two-dimension sensor array. The two-dimension sensor array includes multiple sensor elements, organized as rows and columns. In another embodiment, the electronic system 200 includes a touch-sensor slider 230 coupled to the processing device 210 via bus 231. Touch-sensor slider 230 may include a single-dimension sensor array. The single-dimension sensor array includes multiple sensor elements, organized as rows, or alternatively, as columns. In another embodiment, the electronic system 200 includes touch-sensor buttons 240 coupled to the processing device 210 via bus 241. Touch-sensor button 240 may include a single-dimension or multi-dimension sensor array. The single- or multi-dimension sensor array includes multiple sensor elements. For a touch-sensor button, the sensor elements may be coupled together to detect a presence of a conductive object over the entire surface of the sensing device. Alternatively, the touch-sensor button 240 has a single sensor element to detect the presence of the conductive object. In one embodiment, the touch-sensor button 240 may be a capacitance sensor element. Capacitance sensor elements may be used as non-contact sensors. These sensor elements, when protected by an insulating layer, offer resistance to severe environments.

The electronic system 200 may include any combination of one or more of the touch-sensor pad 220, touch-sensor slider 230, and/or touch-sensor button 240. In another embodiment, the electronic system 200 may also include non-capacitance sensor elements 270 coupled to the processing device 210 via bus 271. The non-capacitance sensor elements 270 may include buttons, light emitting diodes (LEDs), and other user interface devices, such as a mouse, a keyboard, a display, or other functional keys that do not require capacitance sensing. In one embodiment, buses 271, 241, 231, and 221 may be a single bus. Alternatively, these buses may be configured into any combination of one or more separate buses.

The processing device 210 may also provide value-added functionality such as keyboard control integration, LEDs, battery charger, and general purpose I/O, as illustrated as non-capacitance sensor elements 270. Non-capacitance sensor elements 270 are coupled to the GPIO 207.

Processing device 210 may include internal oscillator/clocks 206 and communication block 208. The oscillator/clocks block 206 provides clock signals to one or more of the components of processing device 210. Communication block 208 may be used to communicate with an external component, such as a host processor 250, via host interface (I/F) 251. Alternatively, processing block 210 may also be coupled to embedded controller 260 to communicate with the external components, such as host 250. Interfacing to the host 250 can be through various methods. In one exemplary embodiment, interfacing with the host 250 may be done using a standard PS/2 interface to connect to an embedded controller 260, which in turn sends data to the host 250 via a low pin count (LPC) interface. In some instances, it may be beneficial for the processing device 210 to do both touch-sensor pad and keyboard control operations, thereby freeing up the embedded controller 260 for other housekeeping functions. In another exemplary embodiment, interfacing may be done using a universal serial bus (USB) interface directly coupled to the host 250 via host interface 251. Alternatively, the processing device 210 may communicate to external components, such as the host 250 using industry standard interfaces, such as USB, PS/2, inter-integrated circuit (I2C) bus, system packet interfaces (SPI), or the like. The host 250 and/or embedded controller 260 may be coupled to the processing device 210 with a ribbon or flex cable from an assembly, which houses the sensing device and processing device.

In one embodiment, the processing device 210 is configured to communicate with the embedded controller 260 or the host 250 to send and/or receive data. The data may be a command or alternatively a signal. In an exemplary embodiment, the electronic system 200 may operate in both standard-mouse compatible and enhanced modes. The standard-mouse compatible mode utilizes the HID class drivers already built into the Operating System (OS) software of host 250. These drivers enable the processing device 210 and sensing device to operate as a standard pointer control user interface device, such as a two-button PS/2 mouse. The enhanced mode may enable additional features such as scrolling or disabling the sensing device, such as when a mouse is plugged into the notebook. Alternatively, the processing device 210 may be configured to communicate with the embedded controller 260 or the host 250, using non-OS drivers, such as dedicated touch-sensor pad drivers, or other drivers known by those of ordinary skill in the art.

In one embodiment, the processing device 210 may operate to communicate data (e.g., commands or signals) using hardware, software, and/or firmware, and the data may be communicated directly to the processing device of the host 250, such as a host processor, or alternatively, may be communicated to the host 250 via drivers of the host 250, such as OS drivers, or other non-OS drivers. It should also be noted that the host 250 may directly communicate with the processing device 210 via host interface 251.

In one embodiment, the data sent to the host 250 from the processing device 210 includes click, double-click, movement of the pointer, scroll-up, scroll-down, scroll-left, scroll-right, step Back, and step Forward. In another embodiment, the data sent to the host 250 includes the position or location of the conductive object on the sensing device. Alternatively, other user interface device commands may be communicated to the host 250 from the processing device 210. These commands may be based on gestures occurring on the sensing device that are recognized by the processing device, such as tap, push, hop, drag, and zigzag gestures. Alternatively, other commands may be recognized. Similarly, signals may be sent that indicate the recognition of these operations.

In particular, a tap gesture, for example, may be when the finger (e.g., conductive object) is on the sensing device for less than a threshold time. If the time the finger is placed on the touchpad is greater than the threshold time it may be considered to be a movement of the pointer, in the x- or y-axes. Scroll-up, scroll-down, scroll-left, and scroll-right, step back, and step-forward may be detected when the absolute position of the conductive object is within a pre-defined area, and movement of the conductive object is detected.

Processing device 210 may reside on a common carrier substrate such as, for example, an integrated circuit (IC) die substrate, a multi-chip module substrate, or the like. Alternatively, the components of processing device 210 may be one or more separate integrated circuits and/or discrete components. In one exemplary embodiment, processing device 210 may be a Programmable System on a Chip (PSoC®) processing device, developed by Cypress Semiconductor Corporation, San Jose, Calif. Alternatively, processing device 210 may be one or more other processing devices known by those of ordinary skill in the art, such as a microprocessor or central processing unit, a controller, special-purpose processor, digital signal processor (DSP), an application specific integrated circuit (ASIC), a field programmable gate array (FPGA), or the like. In an alternative embodiment, for example, the processing device may be a network processor having multiple processors including a core unit and multiple microengines. Additionally, the processing device may include any combination of general-purpose processing device(s) and special-purpose processing device(s).

It should also be noted that the embodiments described herein are not limited to having a configuration of a processing device coupled to a host, but may include a system that measures the capacitance on the sensing device and sends the raw data to a host computer where it is analyzed by an application. In effect the processing that is done by processing device 210 may also be done in the host. In another embodiment, the processing device 210 is the host.

In one embodiment, the method and apparatus described herein may be implemented in a fully self-contained touch-sensor pad, which outputs fully processed x/y movement and gesture data signals or data commands to a host. In another embodiment, the method and apparatus may be implemented in a touch-sensor pad, which outputs x/y movement data and also finger presence data to a host, and where the host processes the received data to detect gestures. In another embodiment, the method and apparatus may be implemented in a touch-sensor pad, which outputs raw capacitance data to a host, where the host processes the capacitance data to compensate for quiescent and stray capacitance, and calculates x/y movement and detects gestures by processing the capacitance data. Alternatively, the method and apparatus may be implemented in a touch-sensor pad, which outputs pre-processed capacitance data to a host, where the touchpad processes the capacitance data to compensate for quiescent and stray capacitance, and the host calculates x/y movement and detects gestures from the pre-processed capacitance data. Alternatively, other configurations are possible.

In one embodiment, the electronic system that includes the embodiments described herein may be implemented in a conventional laptop touch-sensor pad. Alternatively, it may be implemented in a wired or wireless keyboard integrating a touch-sensor pad, which is itself connected to a host. In such an implementation, the processing described above as being performed by the "host" may be performed in part or in whole by the keyboard controller, which may then pass fully processed, pre-processed or unprocessed data to the system host. In another embodiment, the embodiments may be implemented in a mobile handset (e.g., cellular or mobile phone) or other electronic devices where the touch-sensor pad may operate in one of two or more modes. For example, the touch-sensor pad may operate either as a touch-sensor pad for x/y positioning and gesture recognition, or as a keypad or other arrays of touch-sensor buttons and/or sliders. Alternatively, the touch-sensor pad, although configured to operate in the two modes, may be configured to be used only as a keypad.

Capacitance sensor 201 may be integrated into the processing device 210, or alternatively, in a separate IC. Alternatively, descriptions of capacitance sensor 201 may be generated and compiled for incorporation into other integrated circuits. For example, behavioral level code describing capacitance sensor 201, or portions thereof, may be generated using a hardware description language, such as VHDL or Verilog, and stored to a machine-accessible medium (e.g., Flash ROM, CD-ROM, hard disk, floppy disk, etc.). Furthermore, the behavioral level code can be compiled into register transfer level ("RTL") code, a netlist, or even a circuit layout and stored to a machine-accessible medium. The behavioral level code, the RTL code, the netlist, and the circuit layout all represent various levels of abstraction to describe capacitance sensor 201.

It should be noted that the components of electronic system 200 may include all the components described above. Alternatively, electronic system 200 may include only some of the components described above, or include additional components not listed herein.

In one embodiment, electronic system 200 may be used in a notebook computer. Alternatively, the electronic device may be used in other applications, such as a mobile handset, a personal data assistant (PDA), a kiosk, a keyboard, a television, a remote control, a monitor, a handheld multi-media device, a handheld video player, a handheld gaming device, or a control panel.

In one embodiment, capacitance sensor 201 may be a capacitance sensing relaxation oscillator (CSR). The CSR may be coupled to an array of sensor elements using a current-programmable relaxation oscillator, an analog multiplexer, digital counting functions, and high-level software routines to compensate for environmental and physical sensor element variations. The sensor array may include combinations of independent sensor elements, sliding sensor elements (e.g., touch-sensor slider), and touch-sensor sensor element pads (e.g., touch pad or touch screen) implemented as a pair of orthogonal sliding sensor elements. The CSR may include physical, electrical, and software components. The physical components may include the physical sensor element itself, typically a pattern constructed on a printed circuit board (PCB) with an insulating cover, a flexible membrane, or a transparent overlay. The electrical component may include an oscillator or other means to convert a capacitance into a measured value. The electrical component may also include a counter or timer to measure the oscillator output. The software component may include detection and compensation algorithms to convert the count value into a sensor element detection decision (also referred to as switch detection decision). For example, in the case of slider sensor elements or X-Y touch-sensor sensor element pads, a calculation for finding position of the conductive object to greater resolution than the physical pitch of the sensor elements may be used.

It should be noted that there are various known methods for measuring capacitance. Although some embodiments described herein are described using a relaxation oscillator, the present embodiments are not limited to using relaxation oscillators, but may include other methods, such as current versus voltage phase shift measurement, resistor-capacitor charge timing, capacitive bridge divider, charge transfer, sigma-delta modulators, charge-accumulation circuits, or the like.

The current versus voltage phase shift measurement may include driving the capacitance through a fixed-value resistor to yield voltage and current waveforms that are out of phase by a predictable amount. The drive frequency can be adjusted to keep the phase measurement in a readily measured range. The resistor-capacitor charge timing may include charging the capacitor through a fixed resistor and measuring timing on the voltage ramp. Small capacitance values may require very large resistors for reasonable timing. The capacitive bridge divider may include driving the capacitor under test through a fixed reference capacitor. The reference capacitor and the capacitor under test form a voltage divider. The voltage signal may be recovered with a synchronous demodulator, which may be done in the processing device 210. The charge transfer may be conceptually similar to an R-C charging circuit. In this method, $C_P$ is the capacitance being sensed. $C_{SUM}$ is the summing capacitor, into which charge is transferred on successive cycles. At the start of the measurement cycle, the voltage on $C_{SUM}$ is discharged. The voltage on $C_{SUM}$ increases exponentially (and only slightly) with each clock cycle. The time for this voltage to reach a specific threshold is measured with a counter. Additional details regarding these alternative embodiments have not been included so as to not obscure the present embodiments, and because these alternative embodiments for measuring capacitance are known by those of ordinary skill in the art.

Figure 3A:
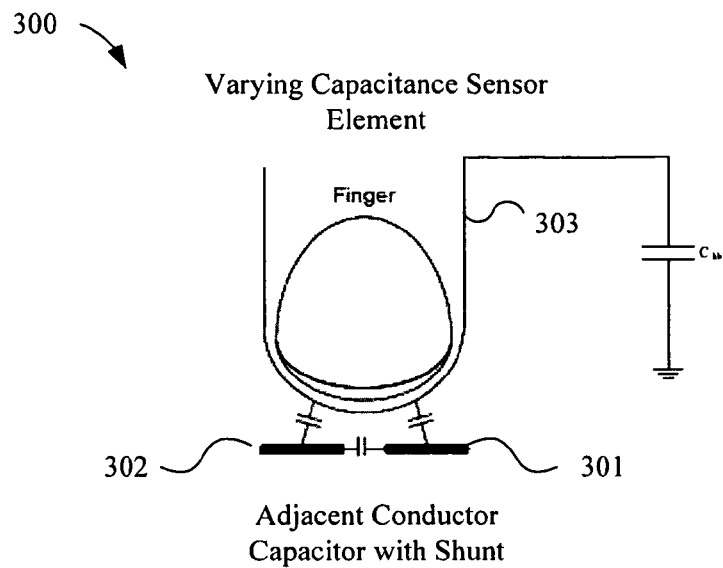
FIG. 3A illustrates a varying capacitance sensor element.

FIG. 3A illustrates a varying capacitance sensor element. In its basic form, a capacitance sensor element 300 is a pair of adjacent conductors 301 and 302. There is a small edge-to-edge capacitance, but the intent of sensor element layout is to minimize the parasitic capacitance $C_P$ between these conductors. When a conductive object 303 (e.g., finger) is placed in proximity to the two conductors 301 and 302, there is a capacitance between electrode 301 and the conductive object 303 and a similar capacitance between the conductive object 303 and the other electrode 302. The capacitance between the electrodes when no conductive object 303 is present is the base capacitance $C_P$ that may be stored as a baseline value. There is also a total capacitance ($C_P+C_F$) on the sensor element 300 when the conductive object 303 is present on or in close proximity to the sensor element 300. The baseline capacitance value $C_P$ may be subtracted from the total capacitance when the conductive object 303 is present to determine the change in capacitance (e.g., capacitance variation $C_F$) when the conductive object 303 is present and when the conductive object 303 is not present on the sensor element. Effectively, the capacitance variation $C_F$ can be measured to determine whether a conductive object 303 is present or not (e.g., sensor activation) on the sensor element 300.

Capacitance sensor element 300 may be used in a capacitance sensor array. The capacitance sensor array is a set of capacitors where one side of each capacitor is connected to a system ground. When the capacitance sensor element 300 is used in the sensor array, when the conductor 301 is sensed, the conductor 302 is connected to ground, and when the conductor 302 is sensed, the conductor 301 is connected to ground. Alternatively, when the sensor element is used for a touch-sensor button, the sensor element is sensed and the sensed button area may be surrounded by a fixed ground. The presence of the conductive object 303 increases the capacitance ($C_P+C_F$) of the sensor element 300 to ground. Determining sensor element activation is then a matter of measuring change in the capacitance ($C_F$) or capacitance variation. Sensor element 300 is also known as a grounded variable capacitor.

The conductive object 303 in this embodiment has been illustrated as a finger. Alternatively, this technique may be applied to any conductive object, for example, a conductive door switch, position sensor, or conductive pen in a stylus tracking system (e.g., stylus).

The capacitance sensor element 300 is known as a projected capacitance sensor. Alternatively, the capacitance sensor element 300 may be a surface capacitance sensor that does not make use of rows or columns, but instead makes use of a single linearized field, such as the surface capacitance sensor described in U.S. Pat. No. 4,293,734. The surface capacitance sensor may be used in touch screen applications.

Figure 3B:
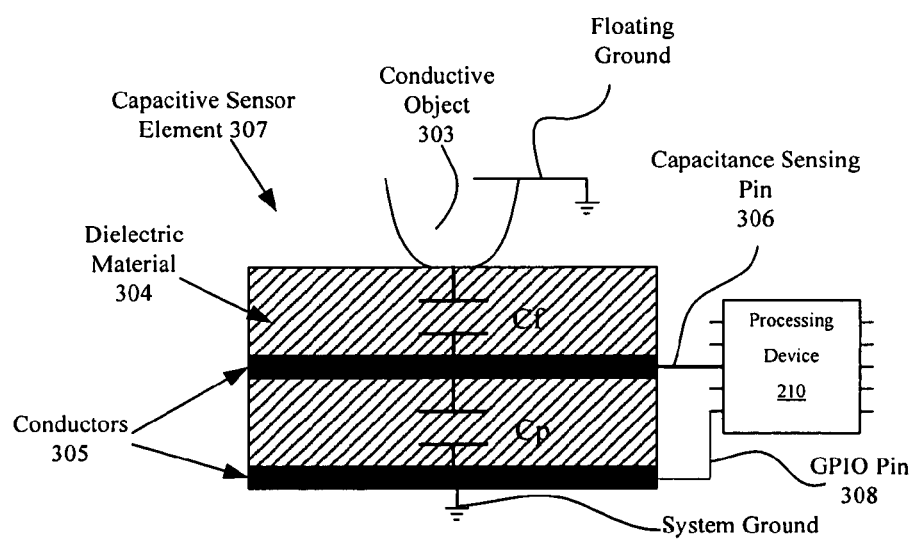
FIG. 3B illustrates one embodiment of a sensing device coupled to a processing device.

FIG. 3B illustrates one embodiment of a capacitance sensor element 307 coupled to a processing device 210. Capacitance sensor element 307 illustrates the capacitance as seen by the processing device 210 on the capacitance sensing pin 306. As described above, when a conductive object 303 (e.g., finger) is placed in proximity to one of the conductors 305, there is a capacitance, $C_F$, between the one of the conductors 305 and the conductive object 303 with respect to ground. This ground, however, may be a floating ground. Also, there is a capacitance, $C_P$, between the conductors 305, with one of the conductors 305 being connected to a system ground. The grounded conductor may be coupled to the processing device 210 using GPIO pin 308. The conductors 305 may be metal, or alternatively, the conductors may be conductive ink (e.g., carbon ink), conductive ceramic (e.g., transparent conductors of indium tin oxide (ITO)), conductive polymers, or the like. In one embodiment, the grounded conductor may be an adjacent sensor element. Alternatively, the grounded conductor may be other grounding mechanisms, such as a surrounding ground plane. Accordingly, the processing device 210 can measure the change in capacitance, capacitance variation $C_F$, as the conductive object is in proximity to one of the conductors 305. Above and below the conductor that is closest to the conductive object 303 is dielectric material 304. The dielectric material 304 above the conductor 305 can be an overlay. The overlay may be non-conductive material used to protect the circuitry from environmental conditions and electrostatic discharge (ESD), and to insulate the user's finger (e.g., conductive object) from the circuitry. Capacitance sensor element 307 may be a sensor element of a touch-sensor pad, a touch-sensor slider, or a touch-sensor button.

Figure 3C:
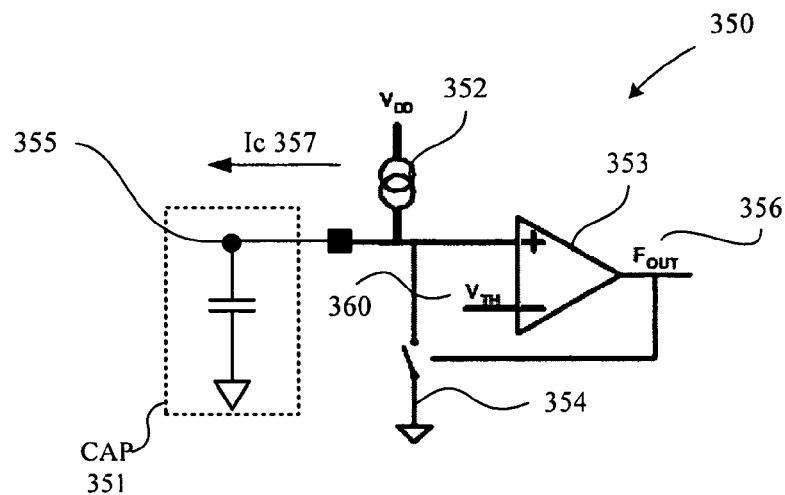
FIG. 3C illustrates one embodiment of a relaxation oscillator for measuring capacitance on a sensor element.

FIG. 3C illustrates one embodiment of a relaxation oscillator. The relaxation oscillator 350 is formed by the capacitance to be measured on capacitor 351, a charging current source 352, a comparator 353, and a reset switch 354 (also referred to as a discharge switch). It should be noted that capacitor 351 is representative of the capacitance measured on a sensor element of a sensor array. The relaxation oscillator is coupled to drive a charging current (Ic) 357 in a single direction onto a device under test ("DUT") capacitor, capacitor 351. As the charging current piles charge onto the capacitor 351, the voltage across the capacitor increases with time as a function of Ic 357 and its capacitance C. Equation (1) describes the relation between current, capacitance, voltage, and time for a charging capacitor.

$$CdV = I_C dt \quad (1)$$

The relaxation oscillator begins by charging the capacitor 351, at a fixed current Ic 357, from a ground potential or zero voltage until the voltage across the capacitor 351 at node 355 reaches a reference voltage or threshold voltage, $V_{TH}$ 360. At the threshold voltage $V_{TH}$ 360, the relaxation oscillator allows the accumulated charge at node 355 to discharge (e.g., the capacitor 351 to "relax" back to the ground potential) and then the process repeats itself. In particular, the output of comparator 353 asserts a clock signal $F_{OUT}$ 356 (e.g., $F_{OUT}$ 356 goes high), which enables the reset switch 354. This discharges the capacitor at node 355 to ground and the charge cycle starts again. The relaxation oscillator outputs a relaxation oscillator clock signal ($F_{OUT}$ 356) having a frequency ($f_{RO}$) dependent upon capacitance C of the capacitor 351 and charging current Ic 357.

The comparator trip time of the comparator 353 and reset switch 354 add a fixed delay. The output of the comparator 353 is synchronized with a reference system clock to guarantee that the reset time is long enough to completely discharge capacitor 351. This sets a practical upper limit to the operating frequency. For example, if capacitance C of the capacitor 351 changes, then $f_{RO}$ changes proportionally according to Equation (1). By comparing $f_{RO}$ of $F_{OUT}$ 356 against the frequency ($f_{REF}$) of a known reference system clock signal (REF CLK), the change in capacitance $\Delta C$ can be measured. Accordingly, equations (2) and (3) below describe that a change in frequency between $F_{OUT}$ 356 and REF CLK is proportional to a change in capacitance of the capacitor 351.

$$\Delta C \propto \Delta f, \text{ where} \quad (2)$$

$$\Delta f = f_{RO} - f_{REF}. \quad (3)$$

In one embodiment, a frequency comparator may be coupled to receive relaxation oscillator clock signal ($F_{OUT}$ 356) and REF CLK, compare their frequencies $f_{RO}$ and $f_{REF}$, respectively, and output a signal indicative of the difference $\Delta f$ between these frequencies. By monitoring $\Delta f$ one can determine whether the capacitance of the capacitor 351 has changed.

In one exemplary embodiment, the relaxation oscillator 350 may be built using a programmable timer (e.g., 555 timer) to implement the comparator 353 and reset switch 354. Alternatively, the relaxation oscillator 350 may be built using other circuitry. Relaxation oscillators are known by those of ordinary skill in the art, and accordingly, additional details regarding their operation have not been included so as to not obscure the present embodiments. The capacitor charging current for the relaxation oscillator 350 may be generated in a register programmable current output DAC (also known as IDAC). Accordingly, the current source 352 may be a current DAC or IDAC. The IDAC output current may be set by an 8-bit value provided by the processing device 210, such as from the processing core 202. The 8-bit value may be stored in a register, in memory, or the like.

In many capacitance sensor element designs, the two "conductors" (e.g., 301 and 302) of the sensing capacitor are actually adjacent sensor elements that are electrically isolated (e.g., PCB pads or traces), as indicated in FIG. 3A. Typically, one of these conductors is connected to a system ground. Layouts for touch-sensor slider (e.g., linear slide sensor elements) and touch-sensor pad applications have sensor elements that may be immediately adjacent. In these cases, all of the sensor elements that are not active are connected to a system ground through the GPIO 207 of the processing device 210 dedicated to that pin. The actual capacitance between adjacent conductors is small ($C_P$), but the capacitance of the active conductor (and its PCB trace back to the processing device 210) to ground, when detecting the presence of the conductive object 303, may be considerably higher ($C_P + C_F$). The capacitance of two parallel conductors is given by the following equation:

$$C = \varepsilon_0 \cdot \varepsilon_R \cdot \frac{A}{d} = \varepsilon_R \cdot 8.85 \cdot \frac{A}{d} \text{pF/m} \quad (4)$$

The dimensions of equation (4) are in meters. This is a very simple model of the capacitance. The reality is that there are fringing effects that substantially increase the sensor element-to-ground (and PCB trace-to-ground) capacitance.

There is some variation of sensor element sensitivity as a result of environmental factors. A baseline update routine, which compensates for this variation, may be provided in the high-level APIs.

As described above with respect to the relaxation oscillator 350, when a finger or conductive object is placed on the sensor element, the capacitance increases from $C_P$ to $C_P+C_F$ so the relaxation oscillator output signal 356 ($F_{OUT}$) decreases in frequency. The relaxation oscillator output signal 356 ($F_{OUT}$) may be fed to a digital counter for measurement. There are two methods for counting the relaxation oscillator output signal 356: frequency measurement and period measurement. Additional details of the relaxation oscillator and digital counter are known by those of ordinary skill in the art, and accordingly a detailed description regarding them has not been included. It should also be noted, that the embodiments described herein are not limited to using relaxation oscillators, but may include other sensing circuitry for measuring capacitance, such as versus voltage phase shift measurement, resistor-capacitor charge timing, capacitive bridge divider, charge transfer, sigma-delta modulators, charge-accumulation circuits, or the like.

Figure 3D:
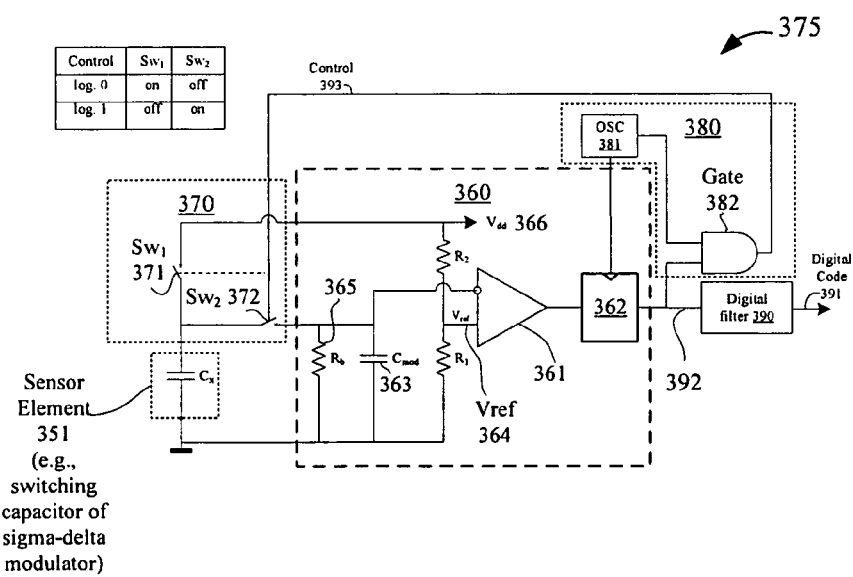
FIG. 3D illustrates a schematic of one embodiment of a circuit including a sigma-delta modulator and a digital filter for measuring capacitance on a sensor element.

FIG. 3D illustrates a schematic of one embodiment of a circuit 375 including a sigma-delta modulator 360 and a digital filter 390 for measuring capacitance on a sensor element 351. Circuit 375 includes a switching circuit 370, switching clock source 380, sigma-delta modulator 360, and digital filter 390 for measuring the capacitance on sensor element 351. Sensor element 351 may be a sensor element of a sensor array, and is represented as a switching capacitor $C_X$ in the modulator feedback loop. Alternatively, sensor element 351 may be a single sensor element, such as used in a touch-sensor button. Switching circuit 370 includes two switches $Sw_1$ 371 and $Sw_2$ 372. The switches $Sw_1$ 371 and $Sw_2$ 372 operate in two, non-overlapping phases (also known as break-before-make configuration). These switches together with sensing capacitor $C_X$ 351 form the switching capacitor equivalent resistor, which provides the modulator capacitor $C_{mod}$ 363 of sigma-delta modulator 360 charge current (as illustrated in FIG. 3D) or discharge current (not illustrated) during one of the two phases.

The sigma-delta modulator 360 includes the comparator 361, latch 362, modulator capacitor $C_{mod}$ 363, modulator feedback resistor 365, which may also be referred to as bias resistor 365, and voltage source 366. The output of the comparator may be configured to toggle when the voltage on the modulator capacitor 363 crosses a reference voltage 364. The reference voltage 364 may be a pre-programmed value, and may be configured to be programmable. The sigma-delta modulator 360 also includes a latch 362 coupled to the output of the comparator 361 to latch the output of the comparator 361 for a given amount of time, and provide as an output, output 392. The latch may be configured to latch the output of the comparator based on a clock signal from the gate circuit 382 (e.g., oscillator signal from the oscillator 381). In another embodiment, the sigma-delta modulator 360 includes a synchronized latch that operates to latch an output of the comparator for a pre-determined length of time. The output of the comparator may be latched for measuring or sampling the output signal of the comparator 361 by the digital filter 390.

Sigma-delta modulator 360 is configured to keep the voltage on the modulator capacitor 363 close to reference voltage $V_{ref}$ 364 by alternatively connecting the switching capacitor resistor (e.g., switches $Sw_1$ 371 and $Sw_2$ 372 and sensing capacitor $C_x$ 351) to the modulator capacitor 363. The output 392 of the sigma-delta modulator 360 (e.g., output of latch 362) is feedback to the switching clock circuit 380, which controls the timing of the switching operations of switches $Sw_1$ 371 and $Sw_2$ 372 of switching circuit 370. For example, in this embodiment, the switching clock circuit 380 includes an oscillator 381 and gate 382. Alternatively, the switching clock circuit 380 may include a clock source, such as a spread spectrum clock source (e.g., pseudo-random signal (PRS)), a frequency divider, a pulse width modulator (PWM), or the like. The output 392 of the sigma-delta modulator 360 is used with an oscillator signal to gate a control signal 393, which switches the switches $Sw_1$ 371 and $Sw_2$ 372 in a non-overlapping manner (e.g., two, non-overlapping phases). The output 392 of the sigma-delta modulator 360 is also output to digital filter 390, which filters and/or converts the output into the digital code 391.

In one embodiment of the method of operation, at power on, the modulator capacitor 363 has zero voltage and switching capacitor resistor (formed by sensing capacitor Cx 351, and switches $Sw_1$ 371 and $Sw_2$ 372) is connected between Vdd line 366 and modulator capacitor 363. This connection allows the voltage on the modulator capacitor 363 to rise. When this voltage reaches the comparator reference voltage, $V_{ref}$ 364, the comparator 361 toggles and gates the control signal 393 of the switches $Sw_1$ 371 and $Sw_2$ 372, stopping the charge current. Because the current via bias resistors $R_b$ 365 continues to flow, the voltage on modulator capacitor 363 starts dropping. When it drops below the reference voltage 364, the output of the comparator 361 switches again, enabling the modulator capacitor 363 to start charging. The latch 362 and the comparator 361 set the sample frequency of the sigma-delta modulator 360.

The digital filter 390 is coupled to receive the output 392 of the sigma-delta modulator 360. The output 392 of the sigma-delta modulator 360 may be a single bit bit-stream, which can be filtered and/or converted to numerical values using a digital filter 390. In one embodiment, the digital filter 390 is a counter. In another embodiment, the standard Sinc digital filter can be used. In another embodiment, the digital filter is a decimator. Alternatively, other digital filters may be used for filtering and/or converting the output 392 of the sigma-delta modulator 360 to provide the digital code 391. It should also be noted that the output 392 may be output to the decision logic 402 or other components of the processing device 210, or to the decision logic 451 or other components of the host 250 to process the bitstream output of the sigma-delta modulator 360.

Described below are the mathematical equations that represent the operations of FIG. 3D. During a normal operation mode, the sigma-delta modulator 360 keeps these currents equal in the average by keeping the voltage on the modulator 363 equal to, or close to, the reference voltage $V_{ref}$ 364. The current of the bias resistor $R_b$ 365 is:

$$I_{Rb} = \frac{V_{cmod}}{R_b} \quad (5)$$

The sensing capacitor $C_x$ 351 in the switched-capacitor mode has equivalent resistance:

$$R_c = \frac{1}{f_s C_x} \quad (6)$$

where $f_s$ is the operation frequency of the switches (e.g., switching circuit 370). If the output 392 of the sigma-delta modulator 360 has a duty cycle of $d_{mod}$, the average current of the switching capacitor 351 can be expressed in the following equation (7):

$$I_c = d_{mod} \frac{V_{dd} - V_{Cmod}}{R_c} \quad (7)$$

In the operation mode $$I_{Rb} = I_c, V_{Cmod} = V_{ref} \text{ or}: \frac{V_{ref}}{R_b} = d_{mod} \frac{V_{dd} - V_{ref}}{R_c} \quad (8)$$

or taking into account that the reference voltage 364 is part of supply voltage:

$$V_{ref} = k_d V_{dd}; k_d = \frac{R_1}{R_1 + R_2} \quad (9)$$

The Equation (8) can be rewritten in the following form:

$$d_{mod} = \frac{R_c}{R_b} \frac{k_d}{1-k_d} = \frac{1}{f_s R_b} \frac{k_d}{1-k_d} \frac{1}{C_x} \quad (10)$$

The Equation (10) determines the minimum sensing capacitance value, which can be measured with the proposed method at given parameters set:

$$d_{mod} \leq 1, \text{ or}: C_{xmin} = \frac{1}{f_s R_b} \frac{k_d}{1-k_d} \quad (11)$$

The resolution of this method may be determined by the sigma-delta modulator duty cycle measurement resolution, which is represented in the following equations:

$$\Delta d_{mod} = \beta \frac{\Delta C_x}{C_x^2}; \quad (12)$$

$$\beta = \frac{1}{f_s R_b} \frac{k_d}{1-k_d}$$

or after rewriting relatively $\Delta C_x$, we obtain:

$$\Delta C_x = \frac{1}{\beta} \Delta d_{mod} C_x^2 \quad (13)$$

In one exemplary embodiment, the resistance of the bias resistor 365 is 20k ohms ($R_b$=20k), the operation frequency of the switches is 12 MHz ($f_s$=12 MHz), the capacitance on the switching capacitor 351 is 15 picofarads ($C_x$=15 pF), and the ratio between Vdd 366 and the voltage reference 364 is 0.25 ($k_d$=0.25), the duty cycle has a 12-bit resolution and the capacitance resolution is 0.036 pF.

In some embodiments of capacitive sensing applications, it may be important to get fast data measurements. For example, the modulator can operate at sample frequency 10 MHz (period is 0.1 microseconds (μs)), for the 12-bit resolution sample, and digital filter as single-type integrator/counter the measurement time is approximately 410 μs (e.g., $2^{12}$*0.1 μs=410 μs). For faster measurement speeds at same resolutions, other types of digital filters may be used, for example, by using the Sinc2 filter, the scanning time at the same resolution may be reduced approximately 4 times. To do this the sensing method should have suitable measurement speed. In one embodiment, a good measurement rate may be accomplished by using a double integrator as the digital filter 390.

Figure 4A:
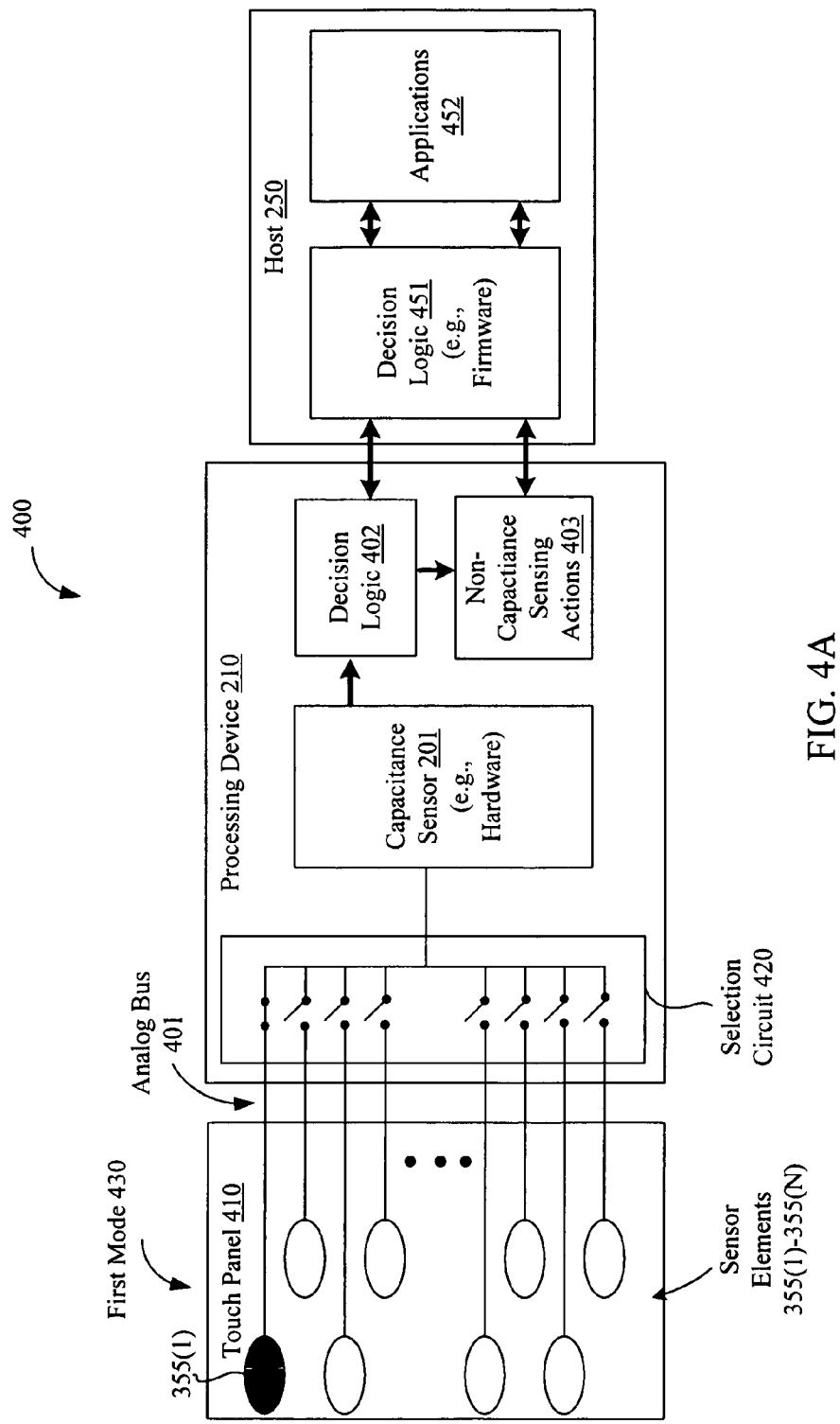
FIG. 4A illustrates a block diagram of one embodiment of an electronic device including a processing device that includes a capacitance sensor for measuring the capacitance on a touch panel in a first mode.

FIG. 4A illustrates a block diagram of one embodiment of an electronic device 400 including a processing device 210 that includes a capacitance sensor 201 for measuring the capacitance on a touch panel 410 in a first mode 430. The electronic device 400 includes the touch panel 410, which includes multiple touch-sensor buttons (e.g., similar to touch-sensor buttons 240 of FIG. 2), processing device 210, and host 250. Touch panel 410 includes sensor elements 355(1)-355(N), where N is a positive integer value that represents the number of touch-sensor buttons of the touch panel 410. Each sensor element 355 corresponds to a button of the touch panel 410. Although the buttons are described as being part of a touch panel, alternatively, the buttons may be separated in multiple touch panels or the buttons may be individually mounted on the device without the use of a touch panel.

The sensor elements 355(1)-355(N) of touch panel 410 are coupled to multiple pins of the processing device 210 via an analog bus 401. Each of the sensor elements 355 are coupled to a pin on the processing device 210. The analog bus 401 is coupled to a selection circuit 420. The selection circuit 420 may be configured to couple the sensor elements 355 individually to the capacitance sensor 201 during the first mode 430 (illustrated in FIG. 4A), and configured to collectively couple a group of sensor elements to the capacitance sensor 201 during the second mode 440 (illustrated in FIG. 4B), or configured to collectively couple a group of sensor elements and a ground conductor to the capacitance sensor 201 during the second mode 450 (illustrated in FIG. 4C). For example in the first mode 430, as illustrated in FIG. 4A, the first sensor element 355(1) is selected (as indicated by the black sensor element of the touch panel 410), and coupled to the capacitance sensor 201 to measure the capacitance on the first sensor element 355(1). After the capacitance has been measured on the first sensor element, the selection circuit 420 opens the switch that connects the first sensor element 355(1) to the capacitance sensor 201, and closes another switch that connects the capacitance sensor 201 to a subsequent sensor element. This is repeated to individually measure the capacitance on each of the sensor elements 355 during the first mode 430. The processing device 210 is configured to perform a capacitance measurement on each of the sensor elements 355(1)-355(N) during each sensing interval when in the first mode 430.

In one embodiment, the selection circuit 420 is configured to sequentially select the individual sensor elements. In another embodiment, the selection circuit 420 is configured to sequentially select sets of sensor elements, such as rows or columns, as described below. The selection circuit 420 may be configured to provide charge current or voltage to the selected sensor elements and to measure a capacitance on the selected sensor elements. In one exemplary embodiment, the selection circuit 420 is a multiplexer array. Alternatively, the selection circuit may be other circuitry inside or outside the capacitance sensor 201 to select the sensor element(s) to be measured.

In another embodiment, the capacitance sensor 201 may be used to measure capacitance on all or less than all of the sensor elements of the touch panel 410. Alternatively, multiple capacitance sensors 201 may be used to measure capacitance on all or less than all of the sensor elements of the touch panel 410. In one embodiment, the selection circuit 420 is configured to connect the sensor elements that are not being measured to the system ground. This may be done in conjunction with a dedicated pin in the GPIO port 207.

In one embodiment, the processing device 210 further includes a decision logic block 402. The operations of decision logic block 402 may be implemented in firmware; alternatively, it may be implemented in hardware or software. The decision logic block 402 may be configured to receive the digital code or counts from the capacitance sensor 201, and to determine the state of the touch panel 410, such as whether a conductive object is detected on or in proximity to the touch panel 410, which button has been pressed on the touch panel 410, or the like.

Figure 4B:
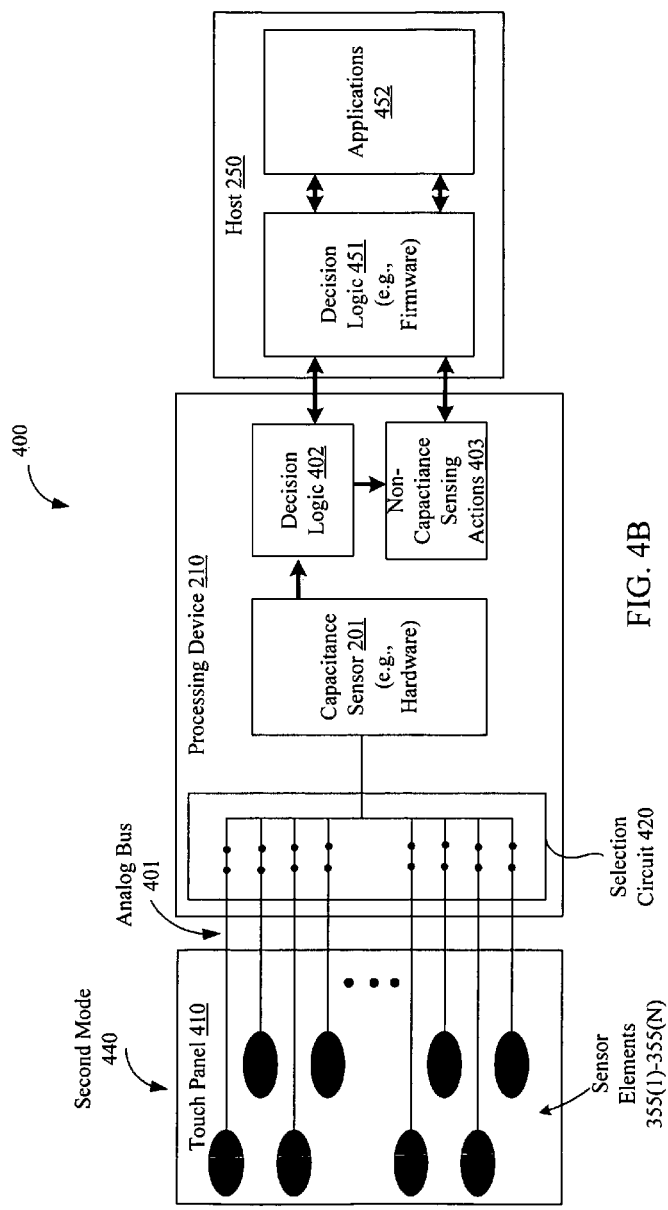
FIG. 4B illustrates one embodiment of the electronic device of FIG. 4A in a second mode.

In another embodiment, instead of performing the operations of the decision logic 402 in the processing device 210, the processing device 201 may send the raw data to the host 250, as described above. Host 250, as illustrated in FIGS. 4A and 4B, may include decision logic 451. The operations of decision logic 451 may also be implemented in firmware, hardware, and/or software. Also, as described above, the host may include high-level APIs in applications 452 that perform routines on the received data, such as compensating for sensitivity differences, other compensation algorithms, baseline update routines, start-up and/or initialization routines, interpolations operations, scaling operations, or the like. The operations described with respect to the decision logic 402 may be implemented in decision logic 451, applications 452, or in other hardware, software, and/or firmware external to the processing device 210.

In another embodiment, the processing device 210 may also include a non-capacitance sensing actions block 403. This block may be used to process and/or receive/transmit data to and from the host 250. For example, additional components may be implemented to operate with the processing device 210 along with the touch panel 410 (e.g., keyboard, keypad, mouse, trackball, LEDs, displays, or the like).

At startup (or boot) the sensor elements (e.g., capacitors 355(1)-(N)) are scanned and the digital code or count values for each sensor element with no activation are stored as a baseline array ($C_P$). The presence of a finger on the sensor element or in proximity to the sensor element is determined by the difference in counts between a stored value for no sensor element activation and the acquired value with sensor element activation, referred to here as Δn. The sensitivity of a single sensor element is approximately:

$$\frac{\Delta n}{n} = \frac{C_F}{C_P} \quad (14)$$

The value of Δn should be large enough for reasonable resolution and clear indication of sensor element activation (e.g., button activation). This drives sensor element construction decisions. $C_F$ should be as large a fraction of $C_P$ as possible. Since $C_F$ is determined by finger area and distance from the finger to the sensor element's conductive traces (through the over-lying insulator), the baseline capacitance $C_P$ should be minimized. The baseline capacitance $C_P$ includes the capacitance of the sensor element pad plus any parasitics, including routing and chip pin capacitance.

In one embodiment, the first mode 430 is a normal mode of operation of the electronic device 400. In another embodiment, the first mode 430 is a "fine" measurement mode and is when the electronic device is active, as opposed to being in "sleep" mode (as described below). In one embodiment, determination of which touch-sensor button of a touch panel 410 is performed in the first mode, while determination of whether a conductive object is present in proximity to the device is performed in the second mode. In one embodiment, the button-activation sensing is performed in the first mode, and the proximity sensing is performed in the second mode. In one embodiment, the processing device 210 is configured to transition from the second mode to the first mode when the presence of the conductive object is detected in proximity to the device in the second mode, and to transition from the first mode to the second mode when the presence of the conductive object is not detected on the device for a period of time in the second mode.

FIG. 4B illustrates the electronic device 400 of FIG. 4A in a second mode 440. In the second mode 440, the selection circuit 420 is configured to couple all of the sensor elements 355(1)-355(N) to the capacitance sensor 201 using individual switches. Instead of measuring the capacitance on each of the sensor elements individually as done in the first mode 430, the capacitance sensor 201 collectively measures a total aggregate capacitance on the coupled sensor elements 355(1)-355(N) in the second mode 440. For example, as illustrated in FIG. 4B, all the sensor elements 355(1)-(N) are selected (as indicated by the black sensor elements of the touch panel 410), and coupled to the capacitance sensor 201 to collectively measure the capacitance on all the sensor elements 355(1)-355(N). The processing device 210 is configured to perform a single capacitance measurement on all the sensor elements 355(1)-355(N) during each sensing interval when in the second mode 440. As described above, in the second mode, a determination of whether a conductive object is present in proximity to the device is performed in the second mode, instead of making a determination as to which button has been activated in the first mode. In one embodiment, the proximity sensing is performed in the second mode, and the button-activation sensing is performed in the first mode.

It should be noted that although the embodiments of FIGS. 4A and 4B illustrate all the sensor elements 355(1)-355(N) being coupled together during the second mode 440, in other embodiments, a fraction of all the sensor elements 355(1)-355(N) may be coupled together during the second mode 440.

The processing device 210 may be configured to individually measure a capacitance on each of the sensor elements 355(1)-355(N) of the electronic device 400 in the first mode 430. The processing device 210 may also be configured to couple a group of (e.g., all or a fraction of) the sensor elements 355(1)-(N), and collectively measure an aggregate capacitance on the group of sensor elements in the second mode 440. The group of sensor elements may be coupled together and the aggregate capacitance measured when detecting a presence of a conductive object on the sensor elements during the first mode 430. In one embodiment, if the no conductive object is detected on the device while individually measuring the capacitance on each of the sensor elements, the processing device transitions from the first mode 430 to the second mode 440. In one embodiment, the second mode 440 is a sleep mode (e.g., reduced power mode). In one embodiment, the electronic device 400 may be placed in the "sleep" mode when the conductive object is not present on the electronic device 400. In another embodiment, the electronic device 400 is placed in the "sleep" mode after a certain number of individual sensing cycles have resulted in no conductive object being detected on the electronic device 400. During "sleep" mode (e.g., second mode 440), the electronic device 400 can periodically scan the group of coupled sensor elements to determine if a conductive object is in proximity to the electronic device 400. When the electronic device 400 detects the presence of the conductive object in proximity to the device in the "sleep" mode (e.g., conductive object is detected while collectively measuring a capacitance on the group of sensor elements), the electronic device 400 may be placed in a normal or active mode (e.g., first mode 430).

In one embodiment, the electronic device 400 continues to individually measure the capacitance on each of the sensor elements and is placed in the "sleep" mode (e.g., second mode 440) for a period of time when the conductive object is not present on the device during the first mode 430. The electronic device 400 may be placed in the "sleep" mode (e.g., second mode 440) after the electronic device 400 has not detected a conductive object on the device after a predetermined period of time. Alternatively, the electronic device 400 may be placed in the "sleep" mode after the electronic device 400 has not detected a conductive object on the device after a certain number, N, individual sensing cycles. Once the predetermined period of time has lapsed, the electronic device 400 transitions from the first mode 430 to the second mode 440. This may be done to conserve power consumption in the electronic device 400.

In the second mode 440, the electronic device 400 collectively measures a capacitance on the group of sensor elements after the period of time has lapsed. If the electronic device 400 does not detect a presence of a conductive object in proximity to the device during the second mode 440, the electronic device 400 may sleep for another period of time. After this period of time, the electronic device 400 wakes and collectively measures a capacitance on the group of sensor elements to detect whether a conductive object is in proximity to the electronic device 400. Once the electronic device 400 detects a presence of the conductive object in proximity to the electronic device 400 during the second mode 440, the electronic device 400 transitions to the first mode 430 to individually measure a capacitance on each of the sensor elements to determine if the conductive object is present on one of the areas of the overlay that correspond to a touch-sensor button.

In one embodiment, while in the second mode 440, the processing device 210 performs a baseline measurement on the group of sensor elements after the group of sensor elements are coupled together. The baseline measurement may be representative of the capacitance on the group of sensor elements when a conductive object is not in proximity to the electronic device 400. The baseline measurement may be measured to account for parasitic capacitance in the device. The baseline measurement may be compared against the capacitance measurements made during the second mode 440. For example, when the group of sensor elements is subsequently measured, if the collectively measured capacitance on the group of sensor elements is greater than the baseline measurement, then a presence of a conductive object is detected on the electronic device. If the collectively measured capacitance is greater than the baseline measurement, the electronic device 400 may transition to the first mode 430 to individually measure a capacitance on each of the sensor elements.

In another embodiment, the collectively measured capacitance can be compared to a threshold above the baseline measurement. For example, if the collectively measured capacitance is greater than the threshold above the baseline measurement, then a conductive object is detected in proximity to the electronic device 400, and the electronic device 400 can transition to the first mode 430 to individually measure the capacitance on each of the sensor elements. Conversely, if the collective measured capacitance is less than the baseline measurement or less than the threshold above the baseline measurement, then a presence of a conductive object is not detected in proximity to the electronic device 400, and the electronic device 400 remains in the second mode 440. The electronic device 400 may be placed in the "sleep" mode for a period of time if the collectively measured capacitance on the group sensor elements is equal to or less than the baseline measurement or the threshold above the baseline measurement.

In one embodiment, the electronic device 400 transitions from the first mode 430 to the second mode 440 when the presence of the conductive object is not detected in proximity to the sensor elements while individually measuring the capacitance on each of the sensor elements in the first mode 430. In another embodiment, the electronic device 400 transitions from the second mode 440 to the first mode 430 when the presence of the conductive object is detected in proximity to the group of sensor elements while collectively measuring the capacitance on the group of sensor elements in the second mode 440. As described above, the group of sensor elements may include all or a fraction of the sensor elements 355.

Figure 4C:
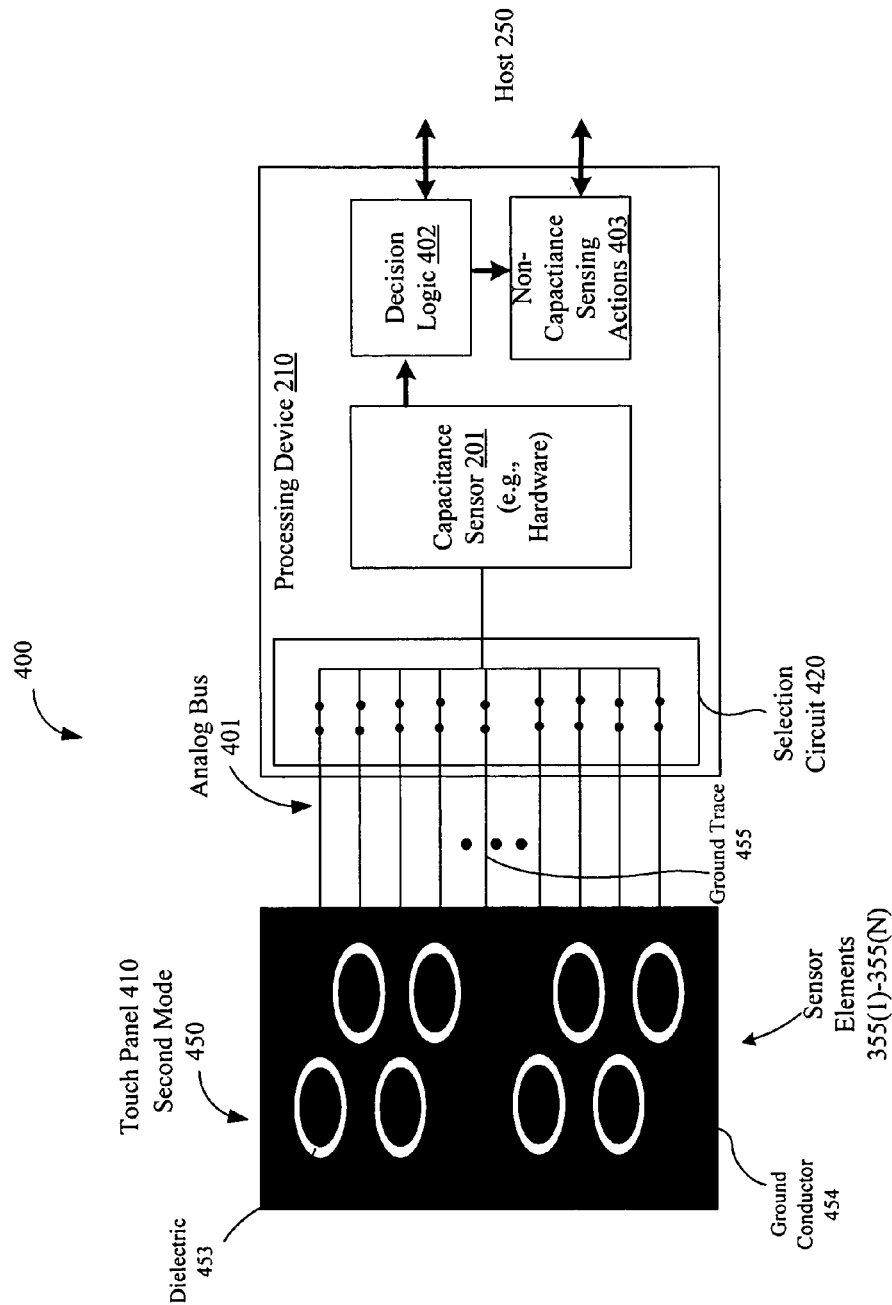
FIG. 4C illustrates another embodiment of the electronic device of FIG. 4A in a second mode.

FIG. 4C illustrates another embodiment of the electronic device of FIG. 4A in a second mode 450. The second mode 450 is similar to the second mode 440 described with respect to FIG. 4B, except in the second mode 450, not only are all the sensor elements 355(1)-355(N) selected (as indicated by the black sensor elements of the touch panel 41) and coupled to the capacitance sensor 201, but the ground conductor 454 is also coupled to the capacitance sensor 201 with the sensor elements 355(1)-355(N) to collectively measure the capacitance on the coupled sensor elements and ground conductor 454. The ground conductor 454 is disposed to partially or completely surround at least one of the sensor elements of the touch panel 410. In another embodiment, the ground conductor 454 is a ground plane disposed to surround each of the sensor elements 355(1)-355(N), as illustrated in FIG. 4C. Alternatively, ground conductor may be separate ground conductors that are separately disposed on the touch panel 410, but include ground traces coupled together to one pin of the processing device via ground trace 455. The ground conductor 454 may have a "fillfactor" of 100%—meaning that the ground conductor 454 is a continuous sheet—or the fillfactor may be less through using a technique such as cross-hatching. The benefit of using a cross-hatching technique may be to reduce the parasitic capacitance of the conductor, thereby increasing the size of the signal (change in capacitance) when expressed as a ratio to the "static" capacitance (i.e., capacitance in the absence of a conductive object). The processing device 210 is configured to perform a single capacitance measurement on all the sensor elements 355(1)-355(N) and the ground conductor 454 during each sensing interval when in the second mode 450. As described above, in the second mode, a determination of whether a conductive object is present in proximity to the device is performed in the second mode, while a determination is made as to which button has been activated in the first mode. In the first mode 430, the ground conductor 454 may be coupled to a ground of the processing device 210 (e.g., via selection circuit 420), for example using the dedicated pin in the GPIO port 207, whereas in the second mode, the ground conductor 454 is coupled to the other sensor elements (e.g., via selection circuit 420), and is used as a sensor element to detect a conductive object in proximity to the electronic device 400. In one embodiment, the proximity sensing is performed in the second mode, and the button-activation sensing is performed in the first mode.

It should be noted that although the embodiments of FIG. 4C illustrate all the sensor elements 355(1)-355(N) being coupled together during the second mode 450, in other embodiments, a fraction of all the sensor elements 355(1)-355(N) may be coupled together with the ground conductor 454 during the second mode 450.

It should also be noted that although the embodiments of FIG. 4C illustrate the ground conductor 454 as being coupled to the sensor elements 355(1)-355(N), in other embodiments, other conductive material may be coupled to the sensor elements 355(1)-355(N) for purposes of proximity detection. For example, in one embodiment, the conductive material of a housing of the electronic device, such as a metal case, metal used to support the electronic device, metal used for radio-frequency (RF) shielding, metal on the surface of the inside or outside of the housing, or the like, is coupled to capacitance sensor 201 along with group of sensor elements 355(1)-355(N) (e.g., all of or a fraction of all the sensor elements) to detect a presence of a conductive object in proximity to the electronic device.

Figure 5:
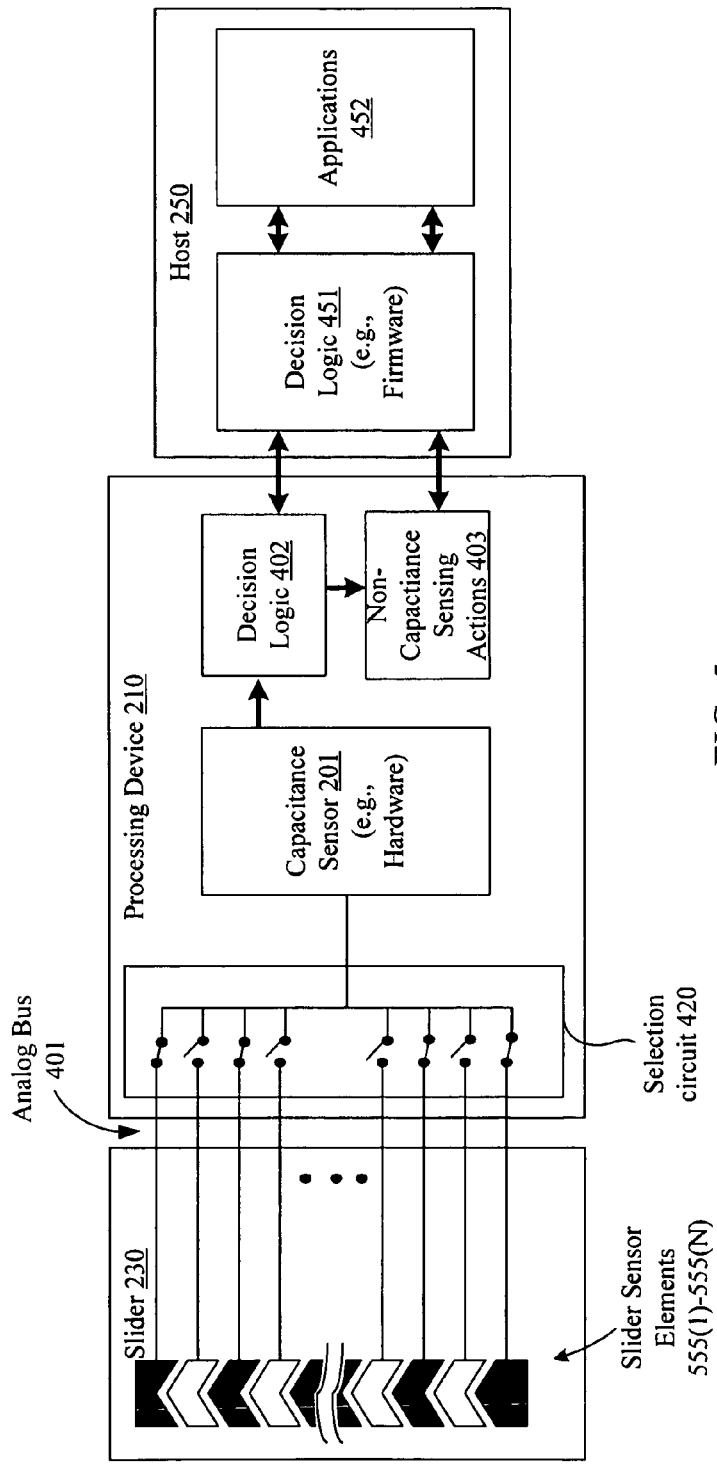
FIG. 5 illustrates a block diagram of one embodiment of an electronic device including a processing device that includes capacitance sensors for measuring the capacitance on a slider.

FIG. 5 illustrates a block diagram of one embodiment of an electronic device 500 including a processing device 210 that includes capacitance sensors 201 for measuring the capacitance on a slider 230. The electronic device 500 is similar to the electronic device 400, except the processing device 210 is coupled to the slider 230 via the selection circuit 420, instead of the touch panel 410.

The slider 230 of FIG. 5 includes multiple sensor elements 555(1)-555(N), where N is a positive integer value that represents the number of sensor elements. In one embodiment, the slider 230 may be a single-dimension sensor array including the sensor elements 555(1)-555(N). The single-dimension sensor array may provide output data to the analog bus 401 of the processing device 210 (e.g., via lines 231 of FIG. 2). The slider 230 may be used for control requiring gradual or discrete adjustments. Examples include a lighting control (dimmer), temperature control, volume control, graphic equalizer, and speed control. Slider controls may also be used for scrolling functions in menus of data. These sensor elements may be mechanically adjacent to one another. Activation of one sensor element may result in partial activation of physically adjacent sensor elements. The actual position in the sliding sensor element is found by computing the centroid location of the set of sensor elements activated, as described below.

The decision logic block 402 may be configured to receive the digital code or counts from the capacitance sensor 201, and to determine the state of the slider 230, such as whether a conductive object is detected on the slider 230, such as which sensor element has been pressed, whether the conductive object is detected in proximity to the device, where the conductive object was detected on the slider 230 (e.g., determining the X-, Y-coordinates of the presence of the conductive object), determining absolute or relative position of the conductive object, whether the conductive object is performing a pointer operation, whether a gesture has been recognized on the slider 230 (e.g., click, double-click, movement of the pointer, scroll-up, scroll-down, scroll-left, scroll-right, step Back, step Forward, tap, push, hop, zigzag gestures, et), or the like.

As described above, the selection circuit 420 is configured to couple each of the sensor elements to the capacitance sensor 201 of the processing device either individually for sequential measurements of the sensor elements in the first mode 430 or collectively for measurements of the coupled sensor elements in the second mode 440 or 450. Alternatively, the sensor elements and the ground conductor may be coupled together for collectively measuring the capacitance. For example, as illustrated in FIG. 5, half of the sensor elements 555(1)-555(N) are selected (as indicated by the black sensor elements of the slider 230) in the second mode 440, and coupled to the capacitance sensor 201 to measure the aggregate capacitance on the coupled sensor elements. However, in the first mode 430, each of the sensor elements 555(1)-555(N) are sequentially selected and coupled to the capacitance sensor 201 of the processing device 210 to individually measure the capacitance on each of the sensor elements 555(1)-555(N). Alternatively, a ground conductor may be coupled to the capacitance sensor 201 along with a group of (e.g., all or a fraction of all) the coupled sensor elements during the second mode 450. The processing device 210 is configured to perform a capacitance measurement on each of the sensor elements 555(1)-555(N) during each sensing interval when in the first mode 430, and to perform a single capacitance measurement on the coupled sensor elements 555(1)-555(N) (e.g., half of the sensor elements) during each sensing interval when in the second mode 440 or 450.

It should be noted that although the embodiments of FIG. 5 illustrate half of the sensor elements 555(1)-555(N) being coupled together during the second mode 440, in other embodiments, other fractions or all of the sensor elements 555(1)-555(N) may be coupled together during the second mode 440 or 450. Coupling less than all of the sensor elements (e.g., a fraction of all the sensor elements) in the second mode 440 may have the advantage of reducing the background parasitic capacitance to ground in the electronic device 500, and thus reduce the time taken to make the single measurement in the second mode 440, as compared to coupling all the sensor elements, and thus further reduce the sleep current.

Figure 6:
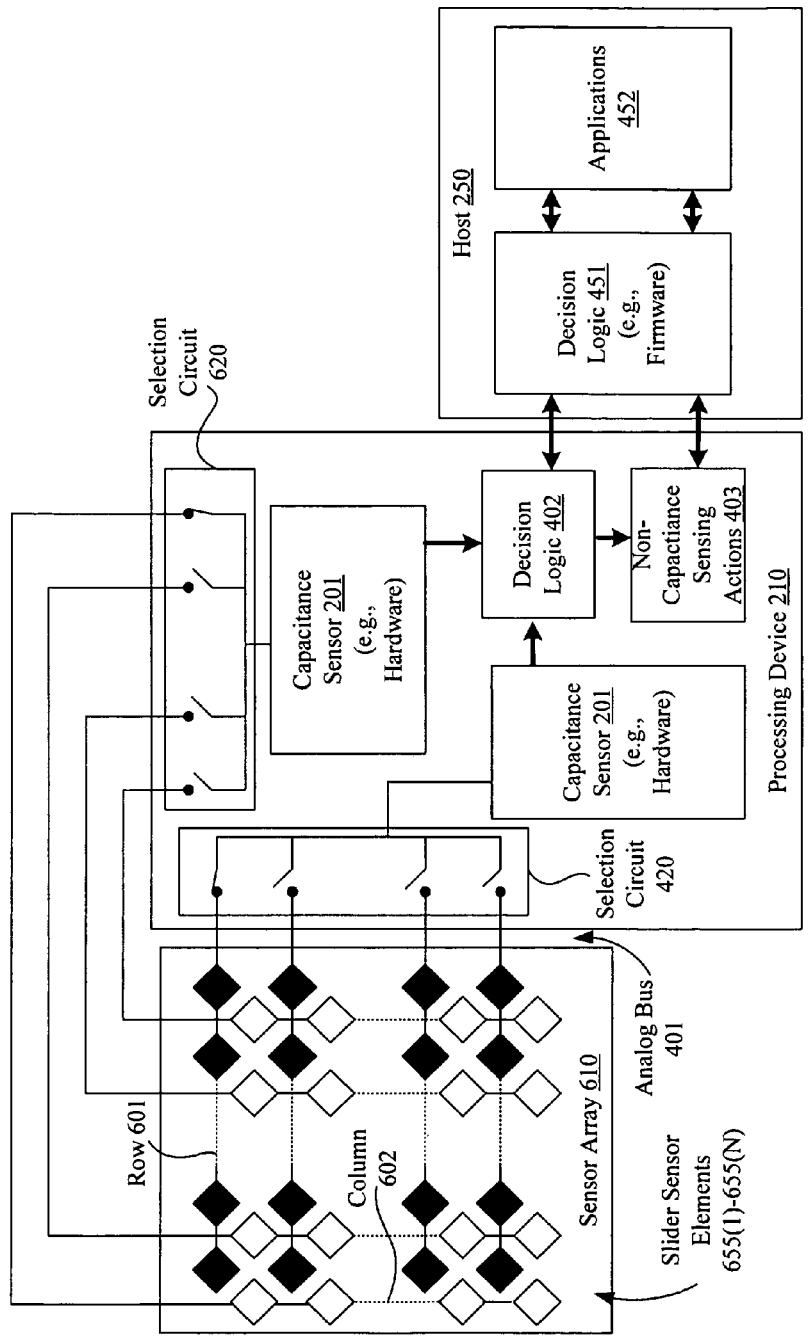
FIG. 6 illustrates a block diagram of one embodiment of an electronic device including a processing device that includes two capacitance sensors for measuring the capacitance on a sensor array.

FIG. 6 illustrates a block diagram of one embodiment of an electronic device 600 including a processing device 210 that includes two capacitance sensors 201 for measuring the capacitance on a sensor array 610. The electronic device 600 is similar to the electronic devices 400 and 500, except the processing device 210 is coupled to the sensor array 610 using two selection circuits 420 and 620 and two capacitance sensors 201. In one embodiment, the sensor array 610 is implemented in the touch-sensor pad 220, as described with respect to FIG. 2. Alternatively, the sensor array 610 may be implemented in other capacitance sensing devices.

In this embodiment, the sensor array 610 is a two-dimension sensor array including the sensor elements 655(1)-655(N), where N is a positive integer value that represents the number of sensor elements of the two-dimension sensor array. The two-dimension sensor array 610 may provide output data to the analog bus 401 of the processing device 210 (e.g., via bus 221).

The sensing array 610 may be used for similar operation as described above with respect to the touch-sensor pad 220. The decision logic block 402 may be configured to receive the digital code or counts from the capacitance sensor 201, and to determine the state of the sensor array 610, such as whether a conductive object is detected on the sensor array 610, whether a conductive object is detected in proximity to the sensor array 610, which sensor element of the sensor array 610 has been pressed, where the conductive object was detected on the sensor array 610 (e.g., determining the X-, Y-coordinates of the presence of the conductive object), determining absolute or relative position of the conductive object, whether the conductive object is performing a pointer operation, whether a gesture has been recognized on the sensor array 610 (e.g., click, double-click, movement of the pointer, scroll-up, scroll-down, scroll-left, scroll-right, step Back, step Forward, tap, push, hop, zigzag gestures, etc), or the like.

As described above, the selection circuit 420 is configured to couple each of the sensor elements to the capacitance sensor 201 of the processing device either individually for sequential measurements of the sensor elements in the first mode 430 or collectively for measurements of the coupled sensor elements in the second mode 440 or 450. In another embodiment, the selection circuits 420 and 620 are configured to couple each of the sensor elements to the capacitance sensors 201 as sets of sensor elements, such as a row or column of sensor elements. The selection circuits 420 and 620 are configured to substantially simultaneously measure two sets of sensor elements at a time. For example, as illustrated in FIG. 6, a first row 601 and a first column 602 are selected in the first mode 430, and coupled to the capacitance sensors 201, respectively, to individually measure the capacitance on the first row and the first column of sensor elements. After the capacitance has been measured on the first row 601 and first column 602, the selection circuits 420 and 620 each open the switch that connects the respective capacitance sensor 201 to the first row 601 and first column 602, and closes another switch that connects the respective capacitance sensor 201 to a subsequent row and a subsequent column, respectively. This is repeated to individually measure the capacitance on each of the rows and each of the columns of the sensor array 610 during the first mode 430. Alternatively, a ground conductor may be coupled to one of the capacitance sensors 201 along with a group of (e.g., all or a fraction of all) the coupled sensor elements during the second mode 450. The processing device 210 is configured to perform a capacitance measurement on each of the rows and columns during each sensing interval when in the first mode 430. However, in the second mode 440 or 450, all of the rows are coupled together to collectively measure an aggregate capacitance on the rows of the sensor array 610. Similarly, in the second mode 440 or 450, all of the columns are coupled together to collectively measure an aggregate capacitance on the columns of the sensor array 610. In one embodiment, the processing device 210 is configured to perform a single capacitance measurement on all the rows of the sensor array 610 during each sensing interval when in the second mode 440 or 450. In another embodiment, the processing device 210 is configured to perform a single capacitance measurement on all the columns of the sensor array 610 during each sensing interval when in the second mode 440 or 450. Alternatively, the processing device 210 is configured to perform both measurements of the all the rows and all the columns during each sensing interval when in the second mode 440.

It should be noted that although the embodiments of FIG. 6 illustrate all of the rows or all of the columns of the sensor array 610 being coupled together during the second mode 440, in other embodiments, fractions of all of the rows or fractions of all of the columns may be coupled together during the second mode 440. For example, half of the columns are coupled together and coupled to the first capacitance sensor 201, and half of the rows are coupled together and coupled to the second capacitance sensor 201. Coupling less than all of the rows and/or columns (e.g., a fraction of all the rows or columns of sensor elements) in the second mode 440 or 450 may have the advantage of reducing the background parasitic capacitance to ground in the electronic device 600, and thus reduce the time taken to make the capacitance measurement(s) in the second mode 440 or 450, as compared to coupling all the rows and/or all the columns of sensor elements.

The sensor array may be a grid-like pattern of sensor elements (e.g., capacitive elements) used in conjunction with the processing device 210 to detect a presence of a conductive object, such as a finger, to a resolution greater than that which is native. The touch-sensor pad layout pattern may be disposed to maximize the area covered by conductive material, such as copper, in relation to spaces necessary to define the rows and columns of the sensor array.

In applications for touch-sensor sliders (e.g., sliding sensor elements) and touch-sensor pads it is often necessary to determine finger (or other capacitive object) position to greater resolution than the native pitch of the individual sensor elements. The contact area of a finger on a sliding sensor element or a touch-pad is often larger than any single sensor element. In one embodiment, in order to calculate the interpolated position using a centroid, the array is first scanned to verify that a given sensor element location is valid. The requirement is for some number of adjacent sensor element signals to be above a noise threshold. When the strongest signal is found, this signal and those immediately adjacent are used to compute a centroid:

$$\text{Centroid} = \frac{n_{i-1} \cdot (i-1) + n_i i + n_{i+1} \cdot (i+1)}{n_{i-1} + n_i i + n_{i+1}} \quad (15)$$

The calculated value may be fractional. In order to report the centroid to a specific resolution, for example a range of 0 to 100 for 12 sensor elements, the centroid value may be multiplied by a calculated or predetermined scalar. It may be more efficient to combine the interpolation and scaling operations into a single calculation and report this result directly in the desired scale. This may be handled in the high-level APIs. Alternatively, other methods may be used to interpolate the position of the conductive object.

Figure 7A:
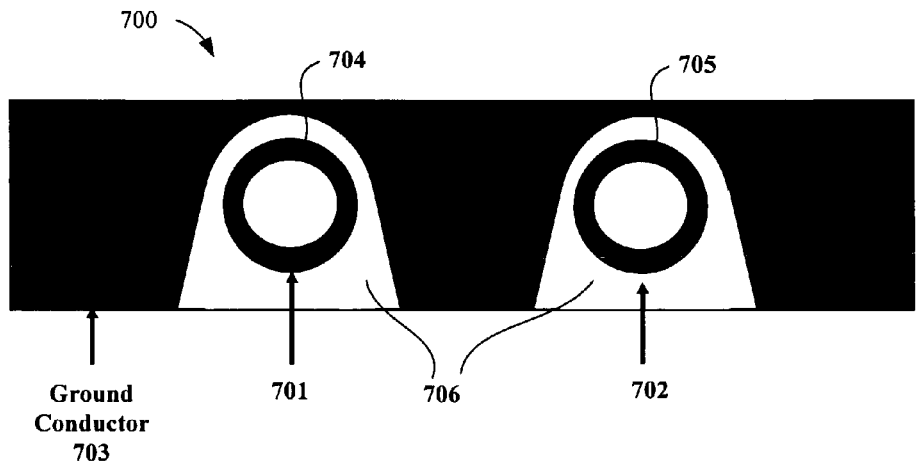
FIG. 7A illustrates a back-side view of one embodiment of a touch panel having two touch-sensor buttons and a ground conductor surrounding the two touch-sensor buttons.

FIG. 7A illustrates a back-side view of one embodiment of a touch panel 700 having two touch-sensor buttons 701 and 702 and a ground conductor 703 surrounding the two touch-sensor buttons 701 and 702. The touch-sensor buttons 701 and 702 each include a sensor element 704 and 705, respectively, which are used by the processing device 210 to detect the presence of the conductive object on the touch-sensor buttons 701 and 702. The ground conductor 703 may be coupled to a ground of the processing device while detecting a presence of the conductive object on touch panel 700, such as in the first mode 430. However, in the second mode the ground conductor 703 may be coupled to the sensor elements 704 and 705, and a collective capacitance is measured on the ground conductor 703, and the sensor elements 704 and 705 to detect a presence of the conductive object in proximity to the touch panel 700, such as in the second mode 450. The processing device 210 may be configured to measure a capacitance on each of the sensor elements 704 and 705 individually in the first mode 430, and to measure a capacitance on all of the sensor elements 704 and 705 collectively in the second mode 440. Alternatively, the processing device 210 may be configured to measure a capacitance on each of the sensor elements 704 and 705 individually in the first mode 430, and to measure a capacitance on all of the sensor elements 704 and 705 and the ground conductor 703 collectively in the second mode 450. If the capacitance measured on either of the sensor elements 704 or 705 is greater than a baseline measurement (or a threshold above the baseline measurement), respectively, the touch-sensor button 701 or 702 is registered as having a button activation. If the capacitance measured on all of the sensor elements 704 and 705, and the ground conductor 703 is greater than a baseline measurement (or a threshold above the baseline measurement), the touch panel 700 is registered as having a proximity event.

In this embodiment, the ground conductor 703 is disposed to surround the sensor elements 704 and 705 that correspond to the touch-sensor buttons 701 and 702, respectively. The touch panel 700 also includes an insulation area 706 of non-conductive material. The insulation area 706 is disposed between the ground conductor 703 and the other sensor elements 704 and 705. In particular, the insulation area 706 is disposed so that the ground conductor 703 is disposed to substantially surround the sensor elements 704 and 705, instead of completely surrounding the sensor elements. Alternatively, the ground conductor 703 may be disposed to partially or completely surround the sensor elements 704 and 705.

In this embodiment, the two sensor elements (704 and 705) are coupled to the processing device 210 (e.g., via capacitance sensing pins 306). In one embodiment, the processing device 210 is configured to measure a capacitance on each of the sensor elements 704 and 705, individually, and a collective capacitance on all the sensor elements (e.g., by coupling the two sensor elements 704 and 705 together when measuring). In another embodiment, the processing device 210 is configured to measure a capacitance on each of the sensor elements 704 and 705, individually, and a collective capacitance on all two of the sensor elements and the ground conductors 703 (e.g., by coupling the two sensor elements 704 and 705 and the ground conductors 703 together when measuring).

Figure 7B:
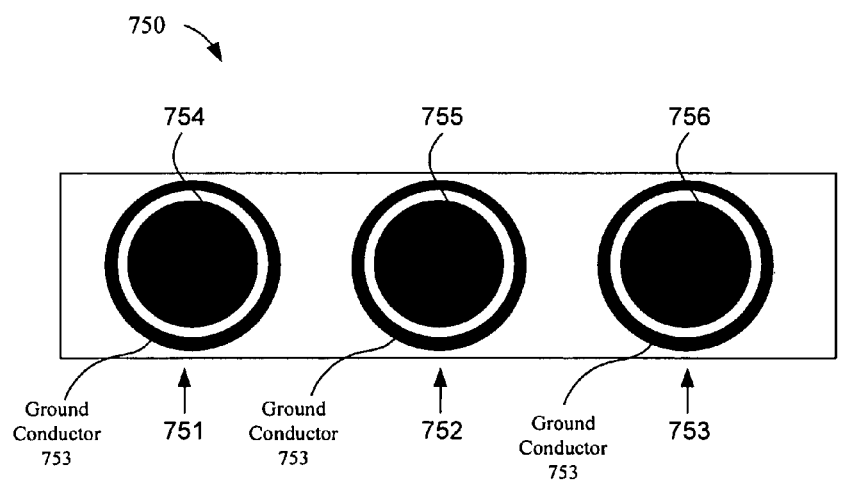
FIG. 7B illustrates a back-side view of one embodiment of a touch panel having three touch-sensor buttons and three ground conductors each surrounding one of the three touch-sensor buttons.

FIG. 7B illustrates a back-side view of one embodiment of a touch panel 750 having three touch-sensor buttons 751, 752, and 753, and three ground conductors 753 each surrounding one of the three touch-sensor buttons. The touch panel 750 is similar to the touch panel 700 of FIG. 7A, except the ground conductors 753 are separate conductors that are each disposed to surround one of the three sensor elements, instead of one single ground conductor, and the touch panel 750 includes three touch-sensor buttons, instead of two. In this embodiment, the ground conductor 753 is of similar dimension and shape as the sensor elements 754, 755, and 756. Alternatively, the ground conductor 753 may have dissimilar dimensions and/or dissimilar shapes as the sensor elements 754, 755, and 756.

In this embodiment, the three sensor elements (754, 755, and 756) are coupled to the processing device 210 (e.g., via capacitance sensing pins 306). In one embodiment, the processing device 210 is configured to measure a capacitance on each of the sensor elements 754, 755, and 756, individually, and a collective capacitance on all the sensor elements (e.g., by coupling the three sensor elements 754, 755, and 756 together when measuring). In another embodiment, the processing device 210 is configured to measure a capacitance on each of the sensor elements 754, 755, and 756, individually, and a collective capacitance on all three of the sensor elements and the ground conductors 753 (e.g., by coupling the three sensor elements 754, 755, and 756 and the ground conductors 753 together when measuring).

The sensor elements of FIG. 7A have been illustrated as rings, having an outer ring of conductive material with an inside of non-conductive material. This is commonly done to allow LED or other backlighting methods to pass through the capacitance sensors to illuminate the touch panel user interface graphics (e.g. key legends). Alternatively, the sensor elements may be other shapes, such as solid circles (illustrated in FIG. 7B), square, rectangular, semi-circle, oval, diamond, hexagonal, pentagonal, octagonal, or the like. Transparent conductive materials such as Indium Tin Oxide (ITO), organic polymers such as Polyethylenedioxythiophene (PEDOT) Polypyrrole, Polyaniline or the like, or other transparent polymers that allow backlight to propagate through them may be used without the need for cutouts as described above.

Figure 7C:
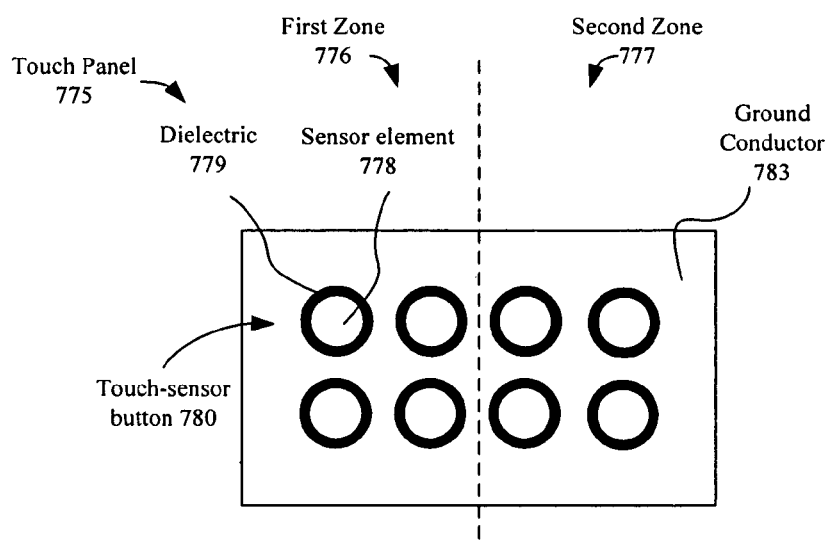
FIG. 7C illustrates a front-side view of one embodiment of a touch panel having four touch-sensor buttons in a first zone and four touch-sensor buttons in a second zone, and a ground conductor surrounding the eight touch-sensor buttons.

FIG. 7C illustrates a front-side view of one embodiment of a touch panel 775 having four touch-sensor buttons 780 in a first zone and four touch-sensor buttons 780 in a second zone, and a ground conductor 783 surrounding the eight touch-sensor buttons 780. The touch panel 775 is similar to the touch panel 700 of FIG. 7A, except the touch panel 775 has eight touch-sensor buttons that are disposed in zones. In this embodiment, the ground conductor 783 is disposed to surround all of the eight touch-sensor buttons 780. However, in the second mode 440 or 450, the sensor elements 778 are coupled together in two zones. Four of the sensor elements 778 are coupled together in a first zone 776, and four of the sensor elements 778 are coupled together in a second zone 777. The first zone 776 of sensor elements 778 are coupled to the processing device 210 via one capacitance sensing pin 306, and the second zone 777 of sensor elements 778 are coupled to the processing device 210 via another capacitance sensing pin 306. In one embodiment, the processing device 210 is configured to measure a capacitance on each of the sensor elements 778, individually, and a collective capacitance on the coupled sensor elements of the first zone 776 and of the second zone 777 (e.g., by coupling the four sensor elements 778 of each zone together when measuring the respective zones). In another embodiment, the processing device 210 is configured to measure a capacitance on each of the sensor elements 778, individually, and a collective capacitance on the first zone 776 and the ground conductor 783 (e.g., by coupling the four sensor elements 778 of the first zone 776 and the ground conductor 783 together when measuring), and a collective capacitance on the second zone 777 and the ground conductor 783 (e.g., by coupling the four sensor elements 778 of the second zone 777 and the ground conductor 783 together when measuring). Alternatively, the ground conductor 783 is coupled to only one of the zones when measuring that particular zone, and not coupled to the other zone when measuring the other zone. In another embodiment, two separate ground conductors are used in each of the zones. The first zone 776 of sensor elements 778 uses one of the ground conductors, and the second zone 777 of sensor elements 778 uses the other ground conductor for proximity sensing. The two ground conductors are coupled together and to the ground of the processing device 210 for button-activation sensing. It should be noted that in other embodiments, the number of zones and/or the number of sensor elements in each zone may be more or less than four.

Figure 8:
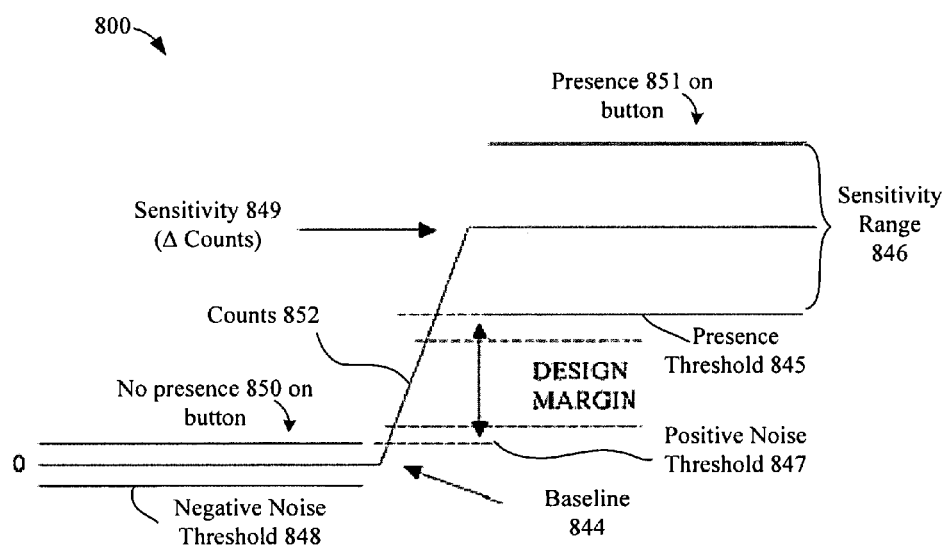
FIG. 8 illustrates a graph of a sensitivity of a single touch-sensor button.

FIG. 8 illustrates a graph of a sensitivity of a single touch-sensor button. Graph 800 includes the counts 852 as measured on a single touch-sensor button for "no presence" 850 on the touch-sensor button, and for a "presence" 851 on the touch-sensor button. In one embodiment, when the "presence" 851 is detected, a button activation is determined. In another embodiment, when the "presence" 851 is detected, a proximity event is determined. The "No presence" 850 occurs when the touch panel does not detect the presence of the conductive object. The "No presence" 850 is detected between a range of noise. The range of noise may include a positive noise threshold 847 and a negative noise threshold 848. So long as the counts 852 are measured as being between the positive and negative thresholds 847 and 848, the touch panel detects "no presence" 850. The "Presence" 851 is when the touch panel detects the presence of the conductive object (e.g., finger). The "Presence" 851 is detected when the counts 852 are greater than a presence threshold 845. The presence threshold 845 indicates that a presence of a conductive object is detected on the touch panel during touch-activation sensing. The sensitivity 849 (Cf/Cp) of the single button operation is such that when it detects the presence of the conductive object, the capacitance variation (Δn) is above the presence threshold 845. The sensitivity 849 may have a range, sensitivity range 846. Sensitivity range 846 may have a lower and upper limit or threshold. The lower threshold is equal to or greater than the presence threshold 845, allowing a "presence" 851 to be detected on or in proximity to the touch-sensor button. The touch panel may be configured such that there is a design margin between the presence threshold 845 and the positive noise threshold 847. The sensitivity range 846 is based on the surface area of the touch-sensor button, as well as other factors.

Although FIG. 8 is usually representative of the sensitivity of a single touch-sensor button, FIG. 8 may also illustrate the sensitivity of a group of coupled sensor elements. It should also be noted that the values of parameters in the graph of FIG. 8 may be different for the different configurations. For example, in scanning a sensor element individually, the presence threshold 845 may be set to have an arbitrary count of 100 counts, based on factors such as scan speed, surface area, and the like. It should be noted in this embodiment, separate baseline measurement can be made for each of the sensor elements that are being measured individually, and the capacitance on a particular sensor element is compared against a presence threshold, such as the presence threshold 845, to determine if the particular sensor element has been activated. However, using the same hardware (e.g., sensor elements, ground conductors, capacitance sensing pins, processing device, and the like), in scanning the group of coupled sensor elements, the presence threshold may be set to have a similar or dissimilar presence threshold, for example, a lower count than the 100 counts used in the other configuration. Alternatively, other thresholds may be set for the different configurations, such as for the button-activation sensing or the proximity sensing.

In one embodiment, the counts 852 of graph 800 are representative of the capacitance measured in the first mode while individually measuring the capacitance on a single sensor element to detect a presence of a conductive object on a device (e.g., button-activation sensing). In this embodiment, a button activation may occur when the counts 852 are above the presence threshold 845. In an embodiment having ten separate buttons, the capacitance is measured individually on each sensor element, such as illustrated on one sensor element in FIG. 8, and a button activation is determined for each of the sensor elements to determine whether any of the buttons have been activated by comparing the counts 852 to the presence threshold 845.

In another embodiment, the counts 852 of graph 800 are representative of the capacitance measured in the second mode while collectively measuring the capacitance on a group of coupled sensor elements to detect a presence of the conductive object in proximity to the device (e.g., proximity event). For example, the counts 852 are representative of the capacitance measured on all, or a fraction of all the sensor elements coupled together during the second mode. In this embodiment, a proximity event occurs when the counts 852 are above the presence threshold 845. In an embodiment having ten buttons, all ten, or a fraction of the ten sensor elements are coupled together, and the capacitance, as represented by the counts 852 in FIG. 8, on the ten sensor elements is used to determine a proximity event for the group of coupled sensor elements.

In another embodiment, the counts 852 of graph 800 are representative of the capacitance measured in the second mode while collectively measuring the capacitance on a group of sensor elements and a ground conductor that are coupled together. A separate baseline measurement may be made, and a different presence threshold may be set for this configuration.

It should be noted that the same hardware (e.g., sensor elements, ground conductors, capacitance sensing pins, processing device, and the like) is used to detect a button activation and a proximity event. For the different configurations, the processing device may be tuned to measure a capacitance for the different configurations and determine a button activation or a proximity event based on the measured capacitance.

Figure 9:
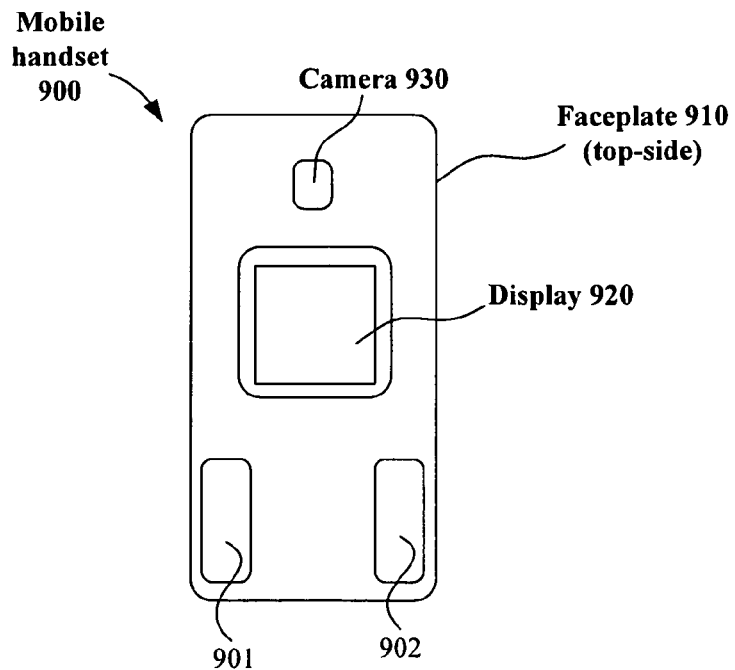
FIG. 9 illustrates a top-side view and a bottom-side view of one embodiment of a case of a mobile handset having two touch-sensor buttons and a ground conductor for button-activation sensing and proximity sensing.
Figure 9:
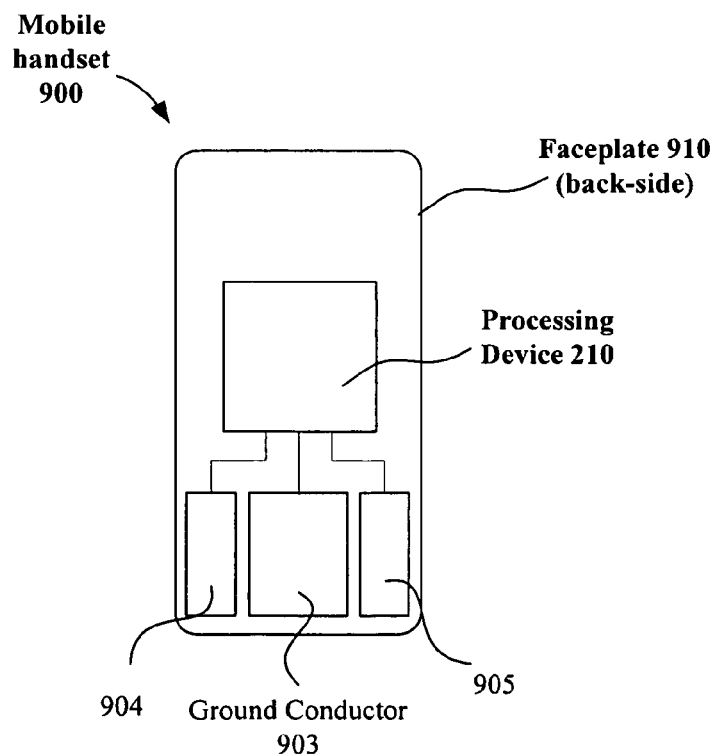

FIG. 9 illustrates a top-side view and a bottom-side view of one embodiment of a case 910 of a mobile handset 900 having two touch-sensor buttons 901 and 902 and a ground conductor 903 for button-activation sensing and proximity sensing. The top-side view illustrates the case 910 (e.g., faceplate or outside housing of the mobile handset 90), which includes openings for a display 920, a camera 930, and touch-sensor buttons 901 and 902. The display 920 may be configured to display text, images, and/or video. The camera 930 may be configured to capture images and/or video. The touch-sensor buttons 901 and 902 are configured to be input buttons for the mobile handset 900. The camera 930 and display 920 are known by those of ordinary skill in the art, and accordingly, a detailed description regarding their operation has not been included. The touch-sensor buttons 901 and 902 operate similarly to the touch-sensor buttons described herein. The back-side view illustrates the case 910 to which the processing device 210, sensor elements 904 and 905, and ground conductor 903 are coupled. It should be noted that the mobile handset 900 may include additional components that are known by those of ordinary skill in the art, and may include less components than illustrated in FIG. 9, such as the display 920 or camera 930.

Sensor elements 904 and 905 and ground conductor 903 are coupled to the processing device 210 (e.g., via capacitance sensing pins 306 of processing device 210), using for example, wires or conductive traces. In one embodiment, the processing device 210, sensor elements 904 and 905, and ground conductor 903 are disposed on a common substrate, for example, a substrate of a printed circuit board. Alternatively, the processing device 210, sensor elements 904 and 905, and ground conductor 903 are disposed in other configurations, such as the processing device on one substrate and the sensor elements (904, 904, and 903) are disposed on another substrate or directly on the case 910.

Although ground conductor 903 is illustrated as a sensor element having similar shape to the sensor elements 904 and 905, the ground conductor 903 may have other dimensions and/or shapes than the sensor elements 904 and 905. Similarly, although ground conductor 903 is illustrated as a sensor element disposed between the sensor elements 904 and 905, the ground conductor 903 may be disposed in other configurations, such as disposed to partially surround, substantially surround, or completely surround the sensor elements 904 and 905.

Using the embodiment described herein, as a conductive object is placed in proximity to the mobile handset 900, the processing device 210 may detect the presence of the conductive object, as well as detect the conductive object on the mobile handset 900, such as to detect button activations on touch-sensor buttons 901 and 902.

In one embodiment, the mobile handset 900 includes an operation (e.g., turn on display of camera 930 or a backlight display associated with the touch-sensor buttons 901 and 902) that can be activated by detecting the conductive object in proximity to the mobile handset 900. The proximity sensing may be performed by coupling both of the sensor elements 904 and 905 together via a selection circuit of the processing device 210. Alternatively, the proximity sensing may be performed by coupling both of the sensor elements 904 and 905, and the ground conductor 903 together via the selection circuit. Using the ground conductor 903, the effective surface area of the sensor elements (e.g., 904, 905, and 903) used for proximity sensing is larger than the surface area of sensor elements 904 and 905 for proximity detection, allowing the mobile handset 900 to be tuned to respond to detecting a conductive object in proximity to the mobile handset 900, as well as tuned to respond to detecting the conductive object on the touch-sensor buttons 901 and 902.

In this embodiment, the ground conductor 903 is located between the sensor elements 904 and 905 of the touch-sensor buttons 901 and 902, however, alternatively, the ground conductor 903 may be other sizes and be disposed in other locations for both proximity sensing and button-activation sensing. For example, a ground plane may be disposed to at least partially surround the sensor elements 904 and 905. In another embodiment, the case 910 includes conductive material, such as metal on the faceplate 910, metal on electromechanical buttons of the mobile handset 900, or the like, that is coupled to the processing device 210 for proximity sensing. In this embodiment, for button-activation sensing, the conductive material that is coupled to the processing device for proximity sensing is not coupled to the processing device 210 when individually measuring the capacitance on each of the touch-sensor buttons 901 and 902.

In one embodiment, the ground conductor 903 and sensor elements 904 and 905 are configured to detect a presence of a conductive object (e.g., finger) in proximity to the mobile handset 900 within approximately six to eight inches (6-8 in) of the touch-sensor button. Alternatively, the ground conductor 903 may be configured to detect a presence of a conductive object within less than six inches or further away than eight inches.

Although the embodiments of FIG. 9 have been illustrated as being implemented in a mobile handset 900, alternatively, the embodiments may be implemented in touch panel of a TV, a DVD player, a VCR, a DVR, a receiver, a computer, a radio, a light switch, a fan switch, industrial equipment, or the like. For example, a DVR front panel may include the touch panel including multiple touch-sensor buttons. The touch panel may have a backlight that is illuminated when activated. The backlight of the touch panel shows where the touch-sensor buttons are located, as well as any text associated with the touch-sensor buttons or the touch panel. When not activated, since the backlight is not illuminated, the touch-sensor buttons and/or text are not displayed on the touch panel. Using the embodiments described herein, when a conductive object is detected in proximity to the touch panel, the backlight is activated, exposing the location of the touch-sensor buttons, and the associated text or symbols of the touch-sensor buttons. With the touch panel display activated, the user may select a touch-sensor button, and the touch panel detects a touch activation when the user presses the touch-sensor button. Alternatively, the embodiments described herein may be implemented as touch-sensor buttons, touch-sensor sliders, touch-sensor pads in mobile devices, such as PDAs, mobile handsets (e.g., cellular phones or other mobile phones), handheld multi-media devices, handheld video player, handheld gaming device, radio receivers, personal music players, or the like, or in other electronic devices, such as notebook or desktop computers, kiosks, keyboards, remote controls, monitors, control panels of household appliances (refrigerators, freezers, ovens, microwave ovens, toasters, washer, dryers, dishwashers, or the like).

Figure 10:
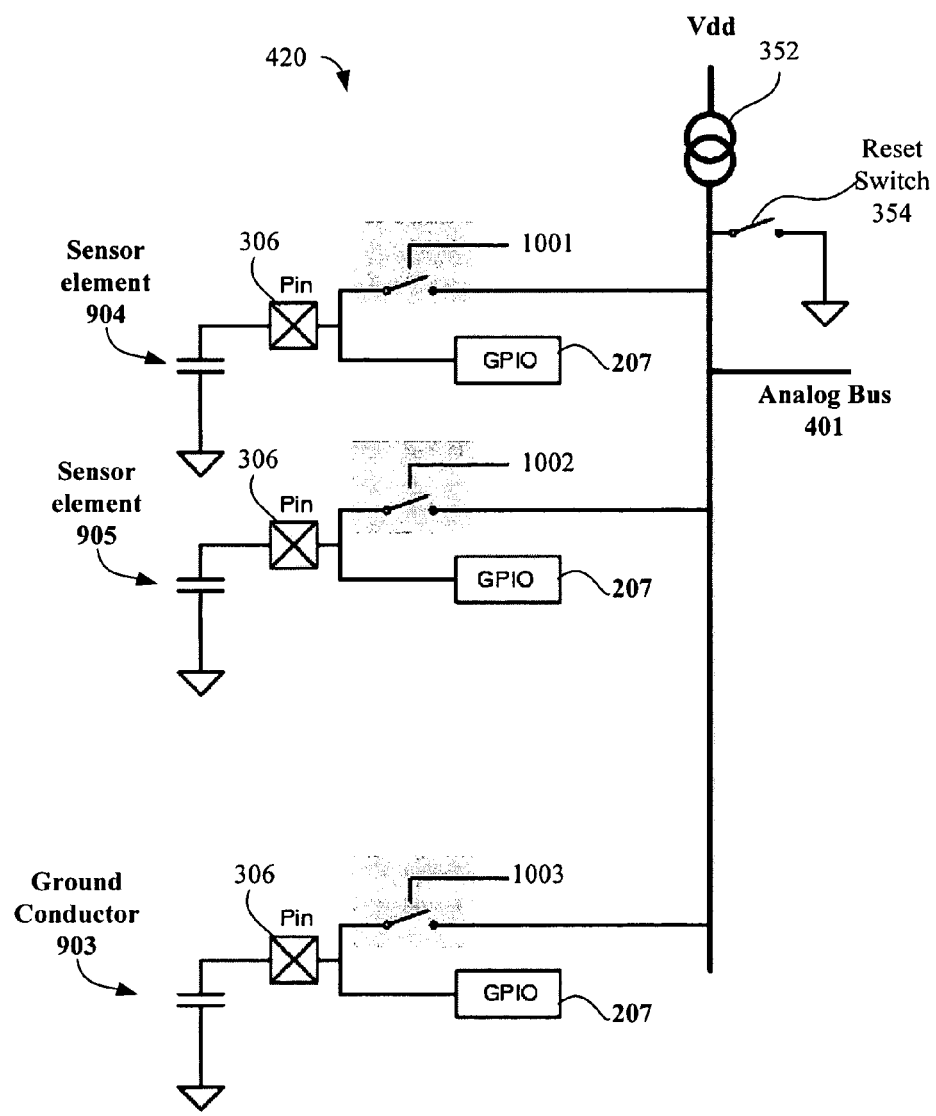
FIG. 10 illustrates one embodiment of a selection circuit coupled to an analog bus for measuring capacitance on the sensor elements and the ground conductor.

FIG. 10 illustrates one embodiment of a selection circuit 420 coupled to an analog bus 401 for measuring capacitance on the sensor elements 904 and 905 and the ground conductor 903. As previously described, the selection circuit 420 is coupled to the sensor elements (e.g., 904, 905, and ground conductor 903) via capacitance sensing pins 306, current source 352, reset switch 354, and a comparator 353 (not illustrated) via analog bus 401. The selection circuit 420 may be configured to sequentially select a sensor element of the multiple sensor elements 904 and 905 to provide the charge current and to measure the capacitance of each sensor element 904 and 905, individually. This may be done in the first mode 430. In the second mode 440, the sensor elements 904 and 905 are selected and coupled together to provide the charge current and to measure a collective capacitance on the coupled sensor elements 904 and 905. In another embodiment, in the second mode 450, the sensor elements 904 and 905, and the ground conductor 903 are selected and coupled together to provide the charge current and to measure a collective capacitance on the coupled sensor elements 904 and 905, and ground conductor 903.

It should be noted that although the selection circuit 420 is illustrated and described with respect to a relaxation oscillator having the current source 352, reset switch 354, and comparator 353, alternatively, the selection circuit 420 is implemented with other types of circuits for measuring capacitance, such as the circuit 375 that includes the sigma-delta modulator 360, or other types of capacitance measuring circuits, such as current versus voltage phase shift measurement, resistor-capacitor charge timing, capacitive bridge divider, charge transfer, sigma-delta modulators, charge-accumulation circuits, or the like.

In one exemplary embodiment, the selection circuit 420 is a multiplexer array of the relaxation oscillator 350 or circuit 375. Alternatively, selection circuit 420 may be other circuitry outside the relaxation oscillator 350 or circuit 375, or even outside the capacitance sensor 201 to select the sensor element to be measured. The selection circuit 420 may also be used to ground the sensor elements that are not being measured. This may be done in conjunction with a dedicated pin in the GPIO port 207. The selection circuit 420 may also be used to couple all the sensor elements 904, 905, and/or ground conductor 903 at the same time. When the sensor elements 904, 905, and 903 are coupled together the processing device 210 may be configured to measure the capacitance on all three sensor elements. Alternatively, the processing device 210 may sequentially or simultaneously scan each of the sensor elements individually. The processing device 210 can select the sensor elements 904, 905, and 903 using selection control lines 1001, 1002, and 1003, respectively.

Figure 11:
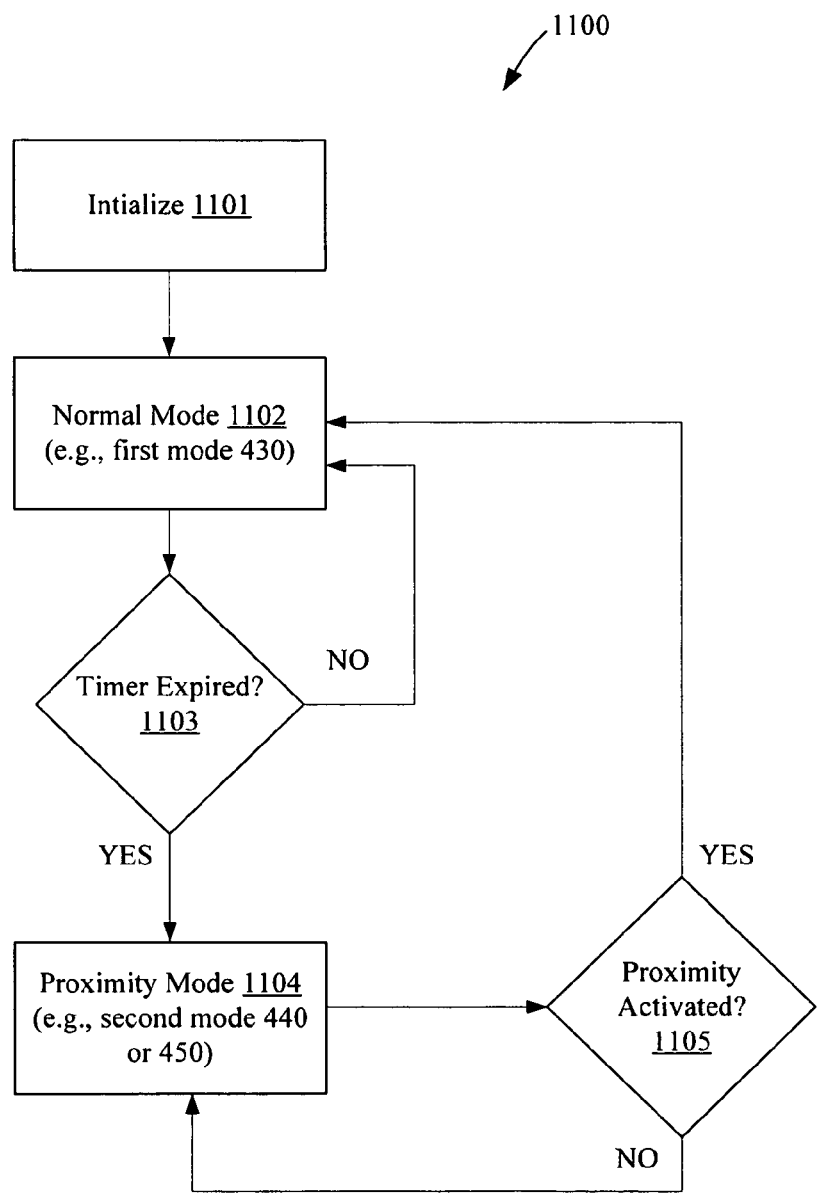
FIG. 11 illustrates a flow chart of one embodiment of a method for button-activation sensing and proximity sensing.

FIG. 11 illustrates a flow chart of one embodiment of a method 1100 for button-activation sensing and proximity sensing. Method 1100 is initialized in operation 1101, and once initialized, the device is placed in the normal mode, operation 1102. The normal mode 1102 may be the first mode 430, in which the device is configured to perform button-activation sensing. In one embodiment, while in the normal mode, a presence of a conductive object is detected on a device by individually measuring a capacitance on each of the sensor elements of the device. In normal mode, detection algorithms may be performed. The detection algorithms may include whether a presence of the conductive object is present on the device, which sensor element and corresponding button has been activated, the location of the presence of the conductive object on the device, whether a gesture is recognized, or the like. In one embodiment, a button activation is determined when the conductive object is detected on a first sensor element using the capacitance measured on the first sensor element. Upon determining the button activation, a button operation may be performed.

A timer may be set in the normal mode, and the method determines whether the timer has expired in operation 1103 without a button activation being detected. If the timer has not expired, the method continues in normal mode 1102. However, if the timer has expired in operation 1103 without a button activation being detected, the method is placed in the proximity mode, operation 1104. The proximity mode may be the second mode 440 or second mode 450, as described above, in which the device is configured to perform proximity sensing. In one embodiment, while in the proximity mode, a group of sensor elements (e.g., all of or a fraction of all of the sensor elements) are coupled together, and a presence of a conductive object is detected in proximity to the device by collectively measuring a capacitance on the group of sensor elements of the device, operation 1105. In another embodiment, while in the proximity mode, a ground conductor is coupled to the group of sensor elements while collectively measuring the capacitance on the coupled sensor elements to detect the presence of the conductive object in proximity to the device. It should be noted that the ground conductor is coupled to the capacitance sensing pin of the processing device along with the sensor elements while collective measuring the capacitance for proximity sensing, and coupled to a ground of the processing device while the capacitance is individually measured on each of the sensor elements for button-activation sensing in the normal mode. If in operation 1105, the conductive object is detected in proximity to the device, the method 1100 returns to the normal mode in operation 1102, and may perform a proximity operation, such as activating a display. However, if the conductive object is not detected in proximity to the device, the method remains in the proximity mode in operation 1104. In one embodiment, a proximity event is determined when the conductive object is detected in proximity to the device using the collective capacitance measured on group of sensor elements and/or the ground conductor. Upon determining the proximity event, an operation may be performed, such as activating a display.

In another embodiment, while in the proximity mode, a first group of sensor elements are coupled together in a first zone (e.g., first zone 776) of the device, and a second group of sensor elements are coupled together in a second zone (e.g., second zone 777) of the device. The collective capacitance is measured on each of the first and second zones. Using the collective capacitance, the device determines a first proximity event when the conductive object is detected in proximity to the first zone of the device, and a second proximity event when the conductive object is detected in proximity to the second zone of the device. The first proximity event triggers a first operation, and the second proximity event triggers a second operation. The first and second operations may activate respective portions of a display. Alternatively, other types of operations may be performed in response the first and second proximity events.

Figure 12:
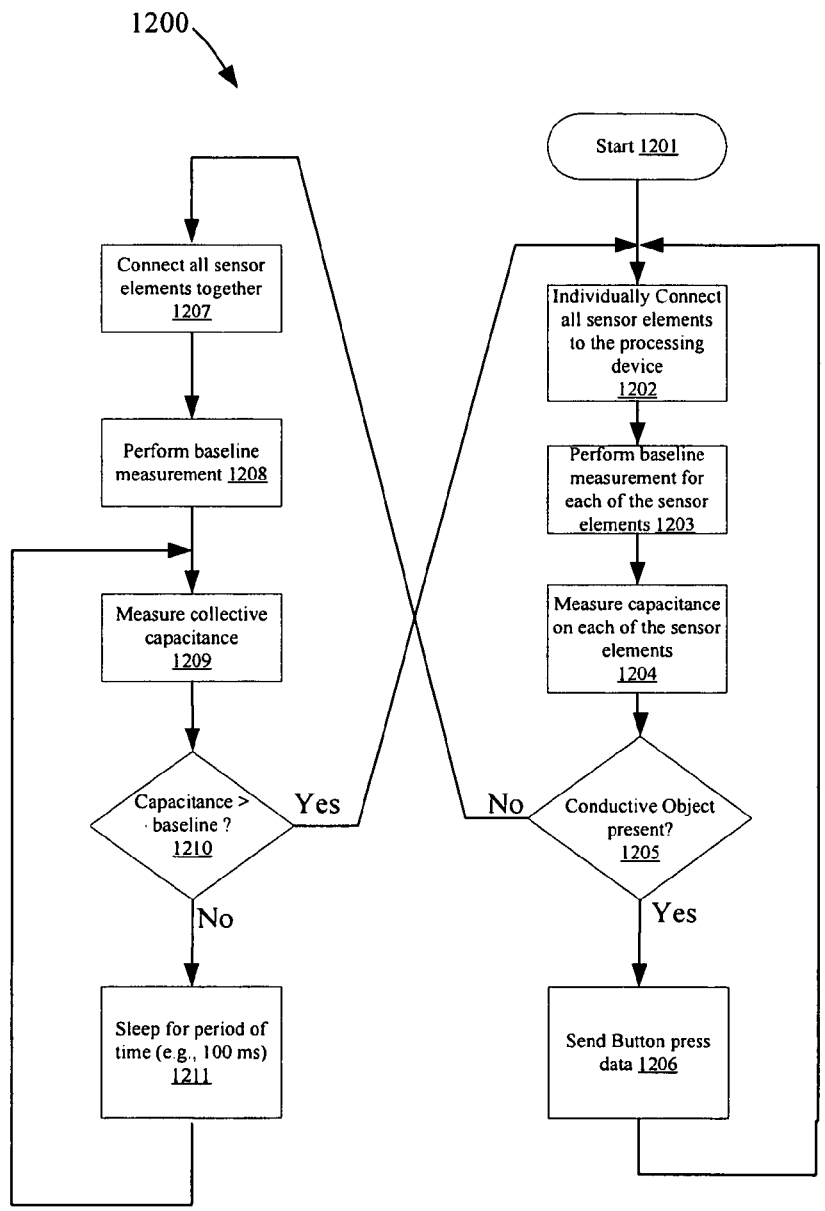
FIG. 12 illustrates a flow chart of one embodiment of a method for coupling a group of sensor elements together when in a reduced power mode.

FIG. 12 illustrates a flow chart of one embodiment of a method 1200 for coupling a group of sensor elements together when in a reduced power mode. Method 1200 starts in operation 1201, and individually connects each of the sensor elements to the processing device in turn, operation 1202, and performs a baseline measurement for each of the sensor elements, operation 1203. The baseline measurement for each of the sensor elements is representative of the capacitance on each of the sensor elements while a conductive object is not present on the device (e.g., the particular sensor element). The method then measures a capacitance on each of the sensor elements in turn, operation 1204. The processing device 210 then performs conductive object detection algorithms. The detection algorithms may include whether a presence of the conductive object is present on the device, which sensor element and corresponding button has been activated, the location of the presence of the conductive object on the device, whether a gesture is recognized, or the like. In one embodiment, each of the capacitances measured the sensor elements are compared with the respective baseline measurement for the particular sensor element. The sensor element is activated when the capacitance is greater than the respective baseline measurement. In another embodiment, the sensor element is activated when the capacitance is greater than a threshold (e.g., presence threshold 845) above the baseline measurement.

The method 1200 then determines whether a conductive object detection algorithm detected the presence of the conductive object, operation 1205. If the presence of the conductive object is detected in operation 1205, the processing device 210 sends button press data to the host 250, operation 1206, and returns to measure a capacitance of each sensor element in turn in operation 1202. However, if the presence of the conductive object is not detected in operation 1205, the processing device 210 connects all (or a fraction of all) of the sensor elements together, operation 1207. This may be done using the selection circuit 420. After all (or a fraction of all) of the sensor elements are coupled together, a baseline measurement is performed, operation 1208. The baseline measurement is representative of the aggregate capacitance on the coupled sensor elements when no conductive object is present on the device. The baseline measurement accounts for the parasitic capacitance of the coupled sensor elements. Once the baseline measurement has been performed in operation 1208, the capacitance is collectively measured on the coupled sensor elements, operation 1209. In one embodiment, the coupled sensor elements include the sensor elements of the touch-sensor buttons. In another embodiment, the coupled sensor elements include the sensor elements of the touch-sensor buttons, as well as a ground conductor.

The method 1200 then determines if the collective capacitance is greater than the baseline measurement performed in operation 1209, operation 1210. In another embodiment, a threshold (e.g., presence threshold 845) above the baseline measurement may be used. If the collective capacitance is greater than the baseline measurement or the threshold (e.g., presence threshold 845) above the baseline measurement, the method 1200 returns to measuring a capacitance of each of the sensor elements in turn of operation 1202. However, if the collective capacitance is not greater than the baseline measurement or the threshold above the baseline measurement, the method 1200 places the device in the reduced power mode (e.g., "sleep" mode) for a period of time (e.g., 100 ms), operation 1211. After the period of time has lapsed, the device wakes and measures the collective capacitance again in operation 1209. This process is repeated until a presence of a conductive object is detecting using the group of sensor elements. Once the conductive object is detected, then the method returns to individually measuring each of the sensor elements.

In one embodiment, the method includes individually measuring a capacitance on each of the sensor elements of a touch-sensor device in a first mode, and collectively measuring the capacitance on the group of sensor elements in a second mode. The second mode may be a lower power mode than the first mode. The second mode includes a reduced power mode that allows the power in the device to be reduced as compared to when the device is in the first mode.

In another embodiment, the method includes individually measuring a capacitance on each of the sensor elements of a touch-sensor device. The method also includes coupling together a group of sensor elements, such as all of or a fraction of all of the sensor elements of the device for proximity sensing. Once the group of sensor elements is coupled together, the method includes collectively measuring a capacitance on the group of sensor elements. This may be done to reduce the amount of power consumption to determine if a conductive object is in proximity to the device or not. If the device continues to determine that no conductive object is in proximity to the device when the sensor elements are coupled together, the device can be placed in a reduced power mode for a period of time, periodically waking to make a coarse measurement of whether a conductive object is in proximity or not. This reduces the power consumption of the device.

In another embodiment, the method includes transitioning from the second mode to the first mode when the presence of the conductive object is detected in proximity to the device in the second mode. The method may also include transitioning from the first mode to the second mode when the presence of the conductive object is not detected on the device for a period of time in the first mode.

Embodiments of the present invention, described herein, include various operations. These operations may be performed by hardware components, software, firmware, or a combination thereof. As used herein, the term "coupled to" may mean coupled directly or indirectly through one or more intervening components. Any of the signals provided over various buses described herein may be time multiplexed with other signals and provided over one or more common buses. Additionally, the interconnection between circuit components or blocks may be shown as buses or as single signal lines. Each of the buses may alternatively be one or more single signal lines and each of the single signal lines may alternatively be buses.

Certain embodiments may be implemented as a computer program product that may include instructions stored on a machine-readable medium. These instructions may be used to program a general-purpose or special-purpose processor to perform the described operations. A machine-readable medium includes any mechanism for storing or transmitting information in a form (e.g., software, processing application) readable by a machine (e.g., a computer). The machine-readable medium may include, but is not limited to, magnetic storage medium (e.g., floppy diskette); optical storage medium (e.g., CD-ROM); magneto-optical storage medium; read-only memory (ROM); random-access memory (RAM); erasable programmable memory (e.g., EPROM and EEPROM); flash memory; electrical, optical, acoustical, or other form of propagated signal (e.g., carrier waves, infrared signals, digital signals, etc.); or another type of medium suitable for storing electronic instructions.

Additionally, some embodiments may be practiced in distributed computing environments where the machine-readable medium is stored on and/or executed by more than one computer system. In addition, the information transferred between computer systems may either be pulled or pushed across the communication medium connecting the computer systems.

Although the operations of the method(s) herein are shown and described in a particular order, the order of the operations of each method may be altered so that certain operations may be performed in an inverse order or so that certain operation may be performed, at least in part, concurrently with other operations. In another embodiment, instructions or sub-operations of distinct operations may be in an intermittent and/or alternating manner.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative sense rather than a restrictive sense.

What is claimed is:

1. A method, comprising:
   detecting a presence of a conductive object on a surface of a device having a multi-dimensional sensory array by individually measuring a capacitance for each of a plurality of sensor elements of the multi-dimensional array;
   coupling a group of sensor elements of the plurality of sensor elements together;
   conductively coupling to the group of sensor elements another conductor substantially surrounding at least one of the plurality of sensor elements; and
   detecting a presence of the conductive object in proximity to the surface of the device by applying a signal to the group of coupled sensor elements to measure a single collective capacitance for the group of coupled sensor elements while the group of coupled sensor elements is conductively coupled to the another conductor substantially surrounding the at least one of the plurality of sensor elements.

2. The method of claim 1, wherein the multi-dimensional sensor array comprises a plurality of rows of sensor elements and a plurality of columns of sensor elements, wherein:
   detecting the presence of the conductive object on the surface of the device comprises:
   measuring capacitances of the plurality of rows; and
   measuring capacitances on the plurality of columns;
   detecting the presence of the conductive object in proximity to the surface of the device comprises:
   coupling the plurality of rows or columns together into the group of sensor elements; and
   measuring the single collective capacitance for the coupled group of sensor elements.

3. The method of claim 2, further comprising:
   determining a proximity event when the conductive object is detected in proximity to surface of the device; and
   determining a position of the conductive object using the measured capacitances on the plurality of rows and columns when the conductive object is detected on the surface of the device.

4. The method of claim 1, wherein detecting the presence of the conductive object on the surface of the device by individually measuring the capacitance is performed in a first mode and detecting the presence of the conductive object in proximity to the surface of the device by measuring the single collective capacitance is performed in a second mode, and wherein the first mode is a normal scanning mode and a second mode is a proximity scanning mode.

5. The method of claim 4, further comprising transitioning from the second mode to the first mode when the presence of the conductive object is detected in proximity to the surface device in the first mode.

6. The method of claim 5, further comprising transitioning from the first mode to the second mode when the presence of the conductive object is not detected on the surface of the device for a period of time.

7. The method of claim 1, wherein coupling the group of sensor elements comprises at least one of coupling all of the plurality of sensor elements together as the group of sensor elements or coupling a fraction of the plurality of sensor elements together as the group of sensor elements.

8. The method of claim 1, wherein coupling the group of sensor elements comprises coupling the group of sensor elements as a first group of coupled sensor elements in a first zone of the device, and wherein the method further comprises:
   coupling a second group of sensor elements of the plurality of sensor elements together in a second zone of the device;
   measuring a first single collective capacitance for the first group of coupled sensor elements and a second single collective capacitance for the second group of coupled sensor elements;
   determining a first proximity event when the conductive object is detected in proximity to the first zone of the device using the first single collective capacitance on the first group of coupled sensor elements; and
   determining a second proximity event when the conductive object is detected in proximity to the second zone of the device using the second single collective capacitance on the second group of coupled sensor elements.

9. The method of claim 8, further comprising:
   performing a first operation upon determining the first proximity event;
   and performing a second operation upon determining the second proximity event.

10. The method of claim 9, wherein performing the first operation comprises activating a first portion of a display, and wherein performing the second operation comprises activating a second portion of the display.

11. An apparatus, comprising:
   a plurality of sensor elements disposed in a multi-dimensional sensor array; and
   a processing device coupled to the plurality of sensor elements in a first mode and coupled to a group of sensor elements of the plurality of sensor elements that is additionally conductively coupled to a conductor substantially surrounding at least one of the plurality of sensor elements in a second mode, wherein the processing device is configured to measure a capacitance for each of the plurality of sensor elements individually to detect a presence of a conductive object on a surface of the apparatus in the first mode and apply a signal to the group of sensor elements to measure a single collective capacitance for the group of sensor elements while the group of sensor elements is conductively coupled to the conductor to detect a presence of the conductive object in proximity to the surface of the apparatus in the second mode.

12. The apparatus of claim 11, further comprising a circuit coupled between the processing device and each of the plurality of sensor elements to individually couple the plurality of sensor elements to the processing device in the first mode, and to collectively couple the group of sensor elements to the processing device in the second mode.

13. The apparatus of claim 11, wherein the processing device is configured to measure a plurality of capacitances of the plurality of sensor elements in the first mode, and to measure the single collective capacitance of the group of sensor elements in the second mode.

14. The apparatus of claim 11, wherein the processing device is configured to perform a single capacitance measurement for the group of sensor elements during each sensing interval when in the second mode, and wherein the processing device is configured to perform a plurality of capacitance measurements for the plurality of sensor elements during each sensing interval when in the first mode.

15. The apparatus of claim 11, wherein the group of sensor elements comprises all of the plurality of sensor elements or a fraction of all of the plurality of sensor elements.

16. The apparatus of claim 11, wherein the processing device is configured to transition from the second mode to the first mode when the presence of the conductive object is detected in proximity to the surface of the apparatus, and to transition from the first mode to the second mode when the presence of the conductive object is not detected on the surface of the apparatus for a period of time.

17. The apparatus of claim 11, wherein the apparatus is a touchpad device comprising the processing device and the plurality of sensor elements.

18. The apparatus of claim 11, wherein the apparatus is a touchscreen device comprising the processing device and the plurality of sensor elements.

19. An apparatus, comprising:
   a device having a touch-sensitive surface and a plurality of sensor elements of a multi-dimensional sensor array;
   means for coupling a group of sensor elements of the plurality of sensor elements together in a first mode;
   means for conductively coupling the group of sensor elements to a conductor that substantially surrounds at least one of the plurality of sensor elements;
   means for applying a signal to the group of sensor elements to measure a single collective capacitance for the group of sensor elements to detect a first presence of a conductive object in proximity to the touch-sensing surface while the group of sensor elements are coupled together and conductively coupled to the conductor that substantially surrounds the at least one of the plurality of sensor elements in the first mode; and
   means for measuring a capacitance for each of the plurality of sensor element individually to detect a second presence of the conductive object on the touch-sensing surface while the group of sensor elements are not coupled together in the a second mode.

20. The apparatus of claim 19, further comprising means for reducing power consumption of the apparatus.

* * * * *